(12) United States Patent
Hahn et al.

(10) Patent No.: US 10,090,045 B2
(45) Date of Patent: Oct. 2, 2018

(54) PROGRAMMING METHOD OF NON VOLATILE MEMORY DEVICE ACCORDING TO PROGRAM SPEED OF MEMORY CELLS

(71) Applicant: Samsung Electronics Co., Ltd., Suwon-si (KR)

(72) Inventors: Wook-ghee Hahn, Hwaseong-si (KR); Chang-yeon Yu, Hwaseong-si (KR); Joo-kwang Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/917,753

(22) Filed: Mar. 11, 2018

(65) Prior Publication Data
US 2018/0204614 A1    Jul. 19, 2018

Related U.S. Application Data

(62) Division of application No. 15/294,995, filed on Oct. 17, 2016, now Pat. No. 9,953,703.

(30) Foreign Application Priority Data

Oct. 16, 2015 (KR) .................... 10-2015-0144972
Nov. 5, 2015 (KR) .................... 10-2015-0155281
Dec. 3, 2015 (KR) .................... 10-2015-0171434

(51) Int. Cl.
*G11C 16/04* (2006.01)
*G11C 11/56* (2006.01)
(Continued)

(52) U.S. Cl.
CPC ...... *G11C 11/5628* (2013.01); *G11C 11/5642* (2013.01); *G11C 16/0466* (2013.01);
(Continued)

(58) Field of Classification Search
CPC ............ G11C 11/5628; G11C 11/5642; G11C 16/0466; G11C 16/0483
(Continued)

(56) References Cited

U.S. PATENT DOCUMENTS 7,221,598 B2   5/2007   Jeong
7,310,280 B2   12/2007  Park et al.
(Continued)

FOREIGN PATENT DOCUMENTS

JP   2011-192827     9/2011
KR   10-2006-0074179  7/2006
(Continued)

*Primary Examiner* — Vu Le
(74) *Attorney, Agent, or Firm* — Muir Patent Law, PLLC

(57) ABSTRACT

Provided is a programming method of a nonvolatile memory device including a plurality of memory cells. The programming method of the nonvolatile memory device includes: programming a first set of memory cells of the plurality of memory cells to a target state based on a primary program voltage such that a threshold voltage distribution of the first set of memory cells is formed; grouping the first set of memory cells into a plurality of cell groups at least one cell group having a different threshold voltage distribution width from others, based on program speeds of the first set of memory cells; and reprogramming remaining cell groups other than a first cell group that is programmed to the target state among the plurality of cell groups, to the target state based on a plurality of secondary program voltages determined based on threshold voltage distribution widths of the plurality of cell groups.

15 Claims, 51 Drawing Sheets

(51) Int. Cl.
*G11C 16/08* (2006.01)
*G11C 16/34* (2006.01)

(52) U.S. Cl.
CPC .......... *G11C 16/0483* (2013.01); *G11C 16/08* (2013.01); *G11C 16/3459* (2013.01)

(58) Field of Classification Search
USPC .................. 365/185.24, 185.28, 185.18
See application file for complete search history.

(56) References Cited

U.S. PATENT DOCUMENTS

| | | | |
|---|---|---|---|
| 7,529,134 B2 | 5/2009 | Hahn et al. | |
| 7,800,946 B2 | 9/2010 | Kim et al. | |
| 7,911,842 B2 | 3/2011 | Park et al. | |
| 7,924,624 B2 | 4/2011 | Kim et al. | |
| 7,944,749 B2 | 5/2011 | Lee et al. | |
| 8,000,149 B2 | 8/2011 | Lee | |
| 8,208,308 B2 | 6/2012 | Han et al. | |
| 8,339,864 B2 | 12/2012 | Park | |
| 8,391,061 B2 | 3/2013 | Elmhurst et al. | |
| 8,446,771 B2 | 5/2013 | Horii | |
| 8,743,606 B2 | 6/2014 | Dutta et al. | |
| 8,767,475 B2 | 7/2014 | Cho et al. | |
| 9,053,793 B2 | 6/2015 | Kim | |
| 2007/0297226 A1 | 12/2007 | Mokhlesi | |
| 2008/0101120 A1 | 5/2008 | Park et al. | |
| 2009/0086544 A1 | 4/2009 | Mokhlesi et al. | |
| 2009/0086545 A1* | 4/2009 | Lee | G11C 16/349 365/185.19 |
| 2010/0157684 A1 | 6/2010 | Kim | |
| 2010/0157685 A1 | 6/2010 | Moschiano et al. | |
| 2011/0299331 A1 | 12/2011 | Kim | |
| 2012/0075931 A1 | 3/2012 | Yuh | |
| 2013/0039130 A1 | 2/2013 | Lee | |
| 2013/0176783 A1 | 7/2013 | Senoo et al. | |
| 2014/0047163 A1 | 2/2014 | Kwak | |
| 2014/0104955 A1 | 4/2014 | Kwak et al. | |
| 2014/0219020 A1 | 8/2014 | Kwak et al. | |
| 2015/0070987 A1* | 3/2015 | Kim | G11C 16/12 365/185.03 |

FOREIGN PATENT DOCUMENTS

| | | |
|---|---|---|
| KR | 10-0806119 B1 | 2/2008 |
| KR | 10-2008-0029561 | 4/2008 |
| KR | 10-0842752 B1 | 7/2008 |
| KR | 10-0849715 B1 | 8/2008 |
| KR | 10-2009-0069861 | 7/2009 |
| KR | 10-0965076 B1 | 6/2010 |

* cited by examiner

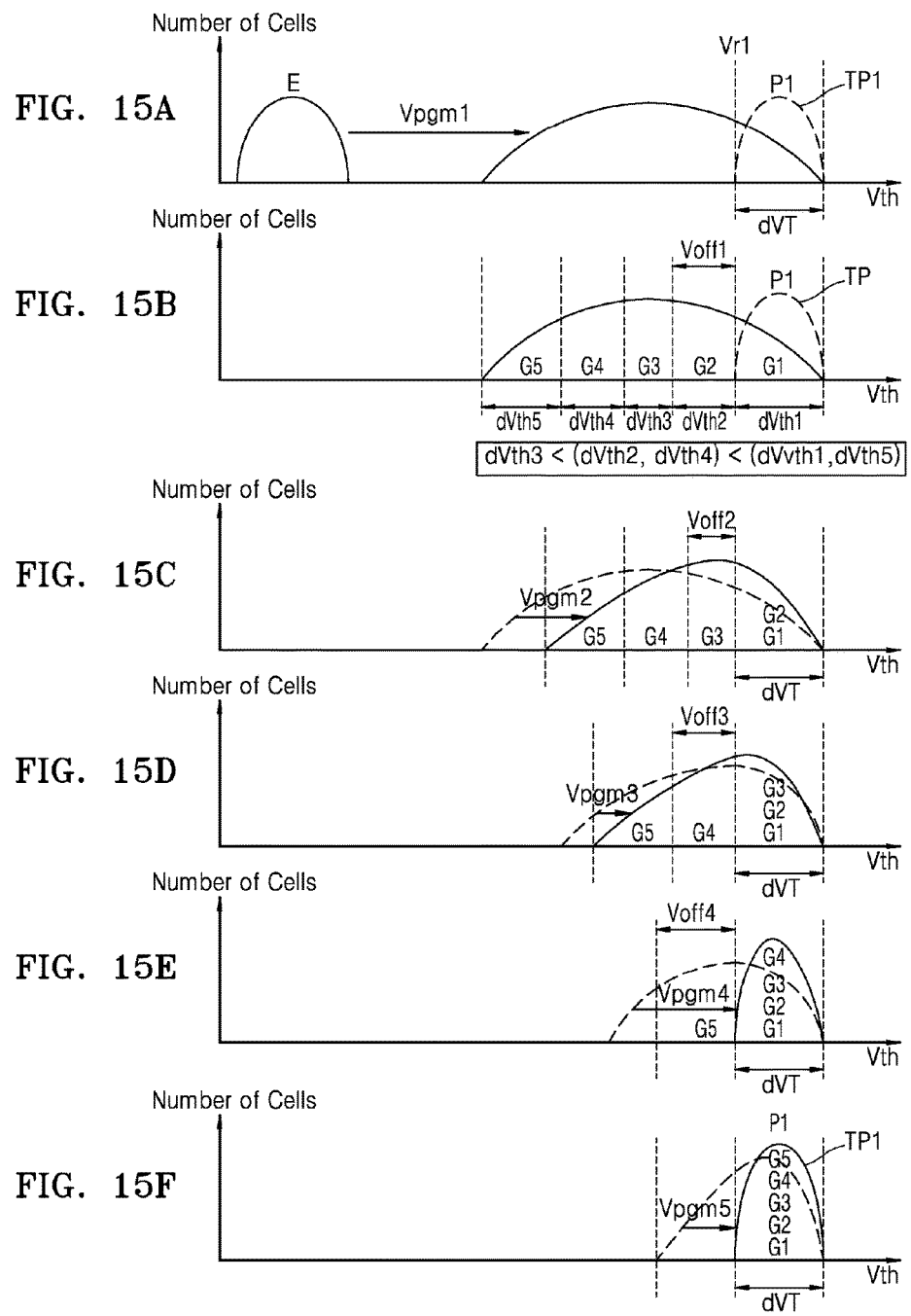

< STEP1: WLn 1st PGM >

< STEP2: WLn+1 1st PGM >

< STEP3: WLn 2nd PGM >

FIG. 33A
< STEP1: WLn 1st PGM >
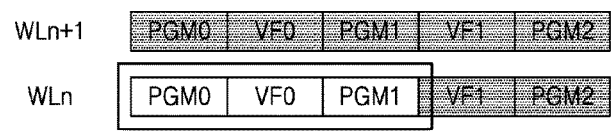
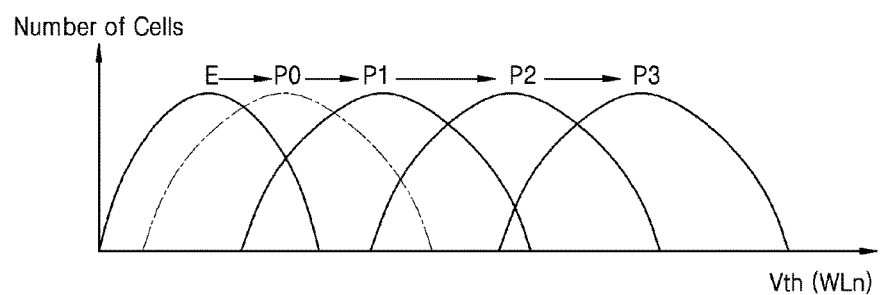

FIG. 33B
< STEP2: WLn+1 1st PGM >
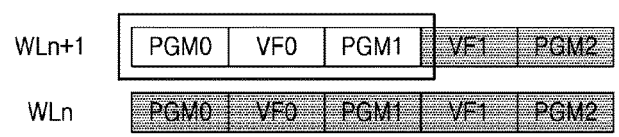
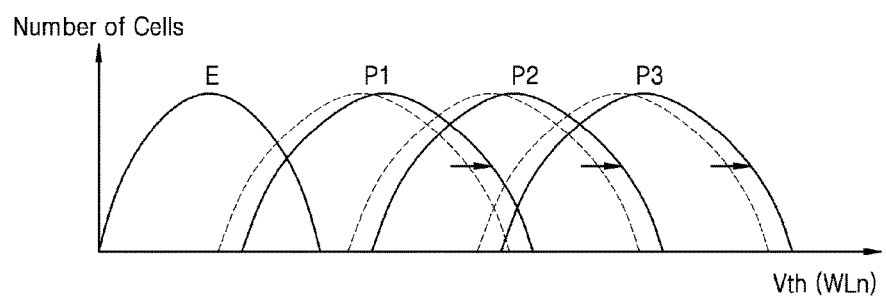

FIG. 33C
< STEP3: WLn 2nd PGM >
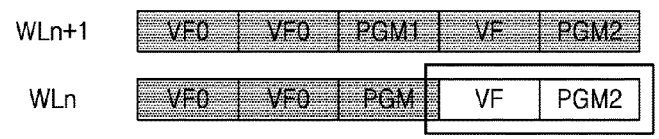
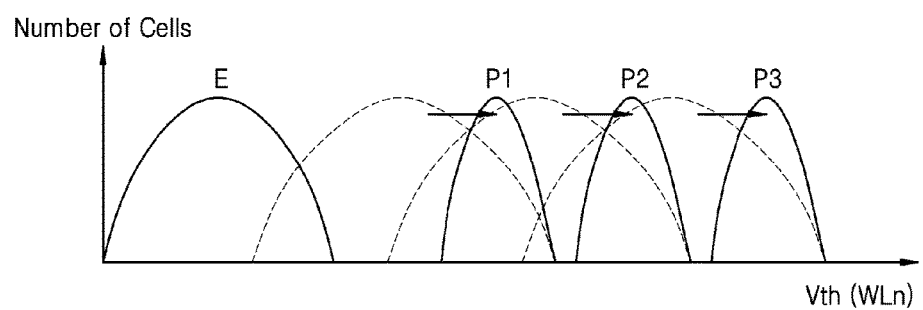

PROGRAMMING METHOD OF NON VOLATILE MEMORY DEVICE ACCORDING TO PROGRAM SPEED OF MEMORY CELLS

CROSS-REFERENCE TO RELATED APPLICATIONS

This application is a Divisional Application of U.S. patent application Ser. No. 15/294,995 filed on Oct. 17, 2016, now Allowed, which claims priority under 35 U.S.C. § 119 to Korean Patent Application No. 10-2015-0144972, filed on Oct. 16, 2015, Korean Patent Application No. 10-2015-0155281, filed on Nov. 5, 2015 and Korean Patent Application No. 10-2015-0171434, filed on Dec. 3, 2015, in the Korean Intellectual Property Office, the disclosures of which are incorporated herein in their entireties by reference.

BACKGROUND

Embodiments of the present disclosure relate to a programming method of a nonvolatile memory device.

Memory devices are typically used to store data and are classified into volatile memory devices and nonvolatile memory devices. A flash memory device is an example of the nonvolatile memory devices and may be used in mobile phones, digital cameras, portable digital assistants (PDA), mobile computer devices, fixed type computer devices, and other devices.

As integration of nonvolatile memory devices has been increasing, it is desired to improve a program speed and a variation of a threshold voltage distribution of these nonvolatile memory devices.

SUMMARY

The present disclosure provides a nonvolatile memory device and a programming method of the nonvolatile memory device, in which a program speed may be increased and a distribution width of threshold voltages of memory cells in a programmed state may be reduced.

According to an aspect of the inventive concept, there is provided a method of programming a nonvolatile memory device including a plurality of memory cells each storing multi-bit data, the method including: programming a first set of memory cells of the plurality of memory cells to a target state based on a primary program voltage such that a threshold voltage distribution of the first set of memory cells is formed; grouping the first set of memory cells into a plurality of cell groups at least one cell group having a different threshold voltage distribution width from others, based on program speeds of the first set of memory cells; and reprogramming remaining cell groups other than a first cell group that is programmed to the target state among the plurality of cell groups, to the target state based on a plurality of secondary program voltages determined based on threshold voltage distribution widths of the plurality of cell groups.

According to another aspect of the inventive concept, there is provided a method of programming a nonvolatile memory device including a plurality of memory cells, the method including: programming a first set of memory cells of the plurality of memory cells to an N−1th program state (N is an integer equal to or greater than 2); detecting a program speed of a word line connected to the first set of memory cells after the programming of the first set of memory cells is performed; adjusting a voltage level of an Nth program voltage set corresponding to an Nth program state based on the detected program speed of the word line; and programming at least some of the first set of memory cells to the Nth program state based on the Nth program voltage set, wherein the programming of the first set of memory cells to the N−1th program state includes grouping the first set of memory cells into a plurality of cell groups at least one cell group having a different threshold voltage range from others according to a program speed of the word line, based on threshold voltage distributions of the first set of memory cells according to a primary program voltage applied to the word line connected to the first set of memory cells, and applying a plurality of secondary program voltages that are set based on the threshold voltage ranges of the plurality of cell groups to some of the plurality of cell groups.

According to another aspect of the inventive concept, there is provided a method of programming a nonvolatile memory device including a plurality of memory cells each cell storing multi-bit data, the method including: programming a first set of memory cells of an nth word line (n is an integer) to a target program state based on a primary program voltage; programming a second set of memory cells of an n+1th word line disposed adjacent to the nth word line based on a primary program voltage; and grouping the first set of memory cells of the nth word line into a plurality of cell groups according to program speeds of the first set of memory cells, at least one cell group having a different threshold voltage range from others, and reprogramming some of the first set of memory cells of the nth word line to the target state based on a plurality of secondary program voltages that are set based on threshold voltage ranges of the plurality of cell groups.

According to another aspect of the inventive concept, there is provided a method of programming a nonvolatile memory device including a plurality of memory cells, the method including: programming a first programming operation to program a first set of memory cells of a first word line to a target program state by applying a first program voltage such that a one-shot distribution based on program speeds of the first set of memory cells is formed, grouping the first set of memory cells into a plurality of cell groups based on the program speeds of the first set of memory cells, each cell group having a threshold voltage distribution width, and a first threshold voltage distribution width of a first cell group corresponding to a middle range of the one-shot distribution is less than each of threshold voltage distribution widths of the remaining cell groups other than the first cell group, and performing a second programming operation to program the first set of memory cells other than memory cells of a second cell group which includes one of the remaining cell groups programmed to the target program state, by applying a plurality of secondary program voltages determined based on the threshold voltage distribution widths.

BRIEF DESCRIPTION OF THE DRAWINGS

Embodiments of the inventive concept will be more clearly understood from the following detailed description taken in conjunction with the accompanying drawings in which:

FIGS. 15A through 15F are graphs showing a programming method in a stepwise manner, according to example embodiments of the present disclosure;

FIGS. 33A through 33C are graphs showing threshold voltage distributions of word lines according to operations of a programming method, according to example embodiments of the present disclosure;

DETAILED DESCRIPTION OF THE EMBODIMENTS

Hereinafter, the disclosure will be described more fully with reference to the accompanying drawings, in which exemplary embodiments of the inventive concept are shown.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As used herein, the term "and/or" includes any and all combinations of one or more of the associated listed items. Expressions such as "at least one of," when preceding a list of elements, modify the entire list of elements and do not modify the individual elements of the list.

Figure 1:
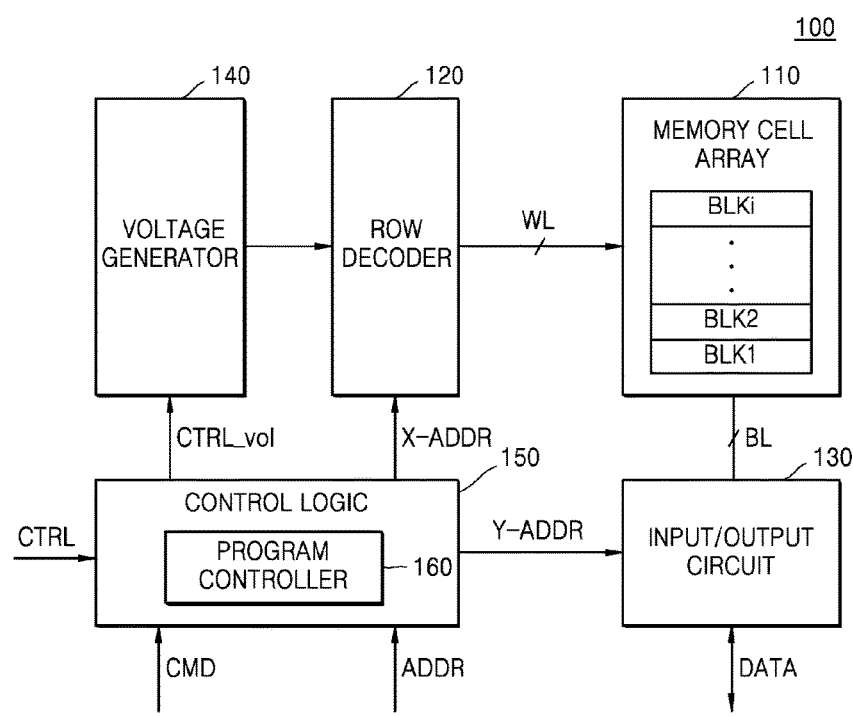
FIG. 1 is a block diagram of a memory device according to example embodiments of the present disclosure.

FIG. 1 is a block diagram of a memory device 100 according to example embodiments of the present disclosure.

Referring to FIG. 1, the memory device 100 may include a memory cell array 110, a row decoder 120, an input/output circuit 130, a voltage generator 140, and a control logic 150. The memory device 100 may be a nonvolatile memory device including nonvolatile memory cells.

The memory cell array 110 may include a plurality of memory cells. For example, the plurality of memory cells may be flash memory cells. Hereinafter, description of embodiments will focus on NAND flash memory cells as the plurality of memory cells. However, embodiments of the present disclosure are not limited thereto, and in other embodiments, the plurality of memory cells may also be resistive memory cells such as resistive random access memories (RRAM), phase change RAMs (PRAM), or magnetic RAMs (MRAM).

According to an embodiment, the memory cell array 110 may be a three-dimensional (3D) memory cell array. The 3D memory cell array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The 3D memory cell array includes vertical NAND strings that are vertically oriented such that at least one memory cell is located over another memory cell. The at least one memory cell may comprise a charge trap layer. However, embodiments of the present disclosure are not limited thereto, and in another embodiment, the memory cell array 110 may be a two-dimensional memory cell array. In another embodiment, the memory cell array 110 may include both of the two-dimensional memory cell array and the 3D memory cell array.

In the present embodiment, each of the memory cells included in the memory cell array 110 may be a multi-level cell (MLC) that may store at least two-bit data. For example, a memory cell may be a MLC storing two-bit data. Alternatively, a memory cell may be a triple level cell (TLC) storing three-bit data. However, the present disclosure is not limited thereto, and in another embodiment, some of memory cells included in the memory cell array 110 may be single level cells (SLC) each storing one-bit data and some other memory cells may be MLCs.

The memory cell array 110 may include a plurality of memory cells, and may be connected to word lines WL, string select lines SSL, ground select lines GSL, and bit lines BL. In detail, the memory cell array 110 may be connected to the row decoder 120 via the word lines WL or the select lines SSL or GSL, and may be connected to the input/output circuit 130 via the bit lines BL.

The memory cell array 110 may include a plurality of memory blocks BL1 through BLKi. The plurality of memory blocks BLK1 through BLKi may include at least one of a single-level cell block including single-level cells, a multi-level cell block including multi-level cells, and a triple level cell block including triple level cells. Some of the plurality of memory blocks included in the memory cell array 110 may be single-level cell blocks, and other blocks may be multi-level cell blocks or triple-level cell blocks.

When an erase voltage is applied to the memory cell array 110, the plurality of memory cells are in an erased state. When a program voltage is applied to a word line of the memory cell array 110, the plurality of memory cells are in a programmed state. Each memory cell may have an erased state E and at least one program state distinguished based on a threshold voltage Vth.

In an embodiment, when a memory cell is a SLC, the memory cell may have an erased state and a program state. In another embodiment, when a memory cell is a MLC, the memory cell may have an erased state and at least three program states.

In the present embodiment, the memory cells may be programmed by being grouped into a plurality of cell groups according to speeds at which they are programmed.

For example, after being programmed based on a preset primary program voltage corresponding to a program state, the memory cells may be grouped into three cell groups according to their program speeds based on a Gaussian threshold voltage distribution (hereinafter referred to as a 'distribution'). Next, other cell groups among the three cell groups, except a first cell group corresponding to an uppermost area of the distribution of the memory cells, may be reprogrammed to the program state based on a plurality of secondary program voltages. The plurality of secondary program voltages may be preset based on a distribution of one-shot memory cells and the primary program voltage. Herein, "one-shot" may refer to "programmed by applying a single program pulse voltage."

In an embodiment, the first cell group is programmed at a highest speed from among the three cell groups, and a distribution of the first cell group may be included in a target distribution of the program state.

In an embodiment, a threshold voltage range of a cell group corresponding to a middle range of a distribution of the memory cells may be narrower than threshold voltage ranges of other cell groups.

The memory cells may be programmed to one of a plurality of program states during one program cycle including the above operations. During a plurality of times of program cycles, memory cells may be programmed to a plurality of program states. For example, when each of the memory cells is a MLC storing two-bit data, the memory cell may have three program states, and each of the memory cells may be programmed to one of the three program states during three program cycles.

The row decoder 120 may select some of the word lines WL in response to a row address X-ADDR. The row decoder 120 transmits a word line voltage to a word line. During a program operation, the row decoder 120 may apply a program voltage and a verification voltage to the selected word lines, and apply a program inhibit voltage to an unselected word line WL. For example, in a read operation, the row decoder 120 may apply a read voltage to a selected word line and a read inhibit voltage to an unselected word line. Also, the row decoder 120 may select some of the string select lines SSL or some of the ground select lines GSL in response to a row address X-ADDR.

The input/output circuit 130 may receive data from an outside (for example, a memory controller) of the memory device 100, and store the data in the memory cell array 110. Also, the input/output circuit 130 may read data from the memory cell array 110, and output the read data to the outside. The input/output circuit 130 may include page buffers (not shown) corresponding to the bit lines BL. The page buffers may be connected to the memory cell array 110 via the bit lines BL, and may select some of the bit lines BL in response to a column address Y-ADDR received from the control logic 150. In a program operation, the page buffers may operate as a write driver to program data DATA to be stored in the memory cell array 110.

The voltage generator 140 may generate various types of voltages used to perform a program operation, a read operation, and an erase operation on the memory cell array 110 based on a voltage control signal CTRL_vol. In detail, the voltage generator 140 may generate a word line voltage such as a program voltage (or a write voltage), a read voltage, a pass voltage (or an unselect word line voltage) or a verification voltage. The voltage generator 140 may generate a bit line voltage such as a bit line forcing voltage or an inhibit voltage. Also, the voltage generator 140 may further generate a string select line voltage and a ground select line voltage based on a voltage control signal CTRL_vol.

The control logic 150 may output various control signals used to write data to the memory cell array 110 or read data from the memory cell array 110 based on a command CMD, an address ADDR, and a control signal CTRL received from the memory controller 200 (FIG. 1). Accordingly, the control logic 150 may control various operations in the memory device 100 overall.

Various control signals output from the control logic 150 may be provided to the voltage generator 140, the row decoder 120, and the input/output circuit 130. In detail, the control logic 150 may provide a voltage control signal CTRL_vol to the voltage generator 140, a row address X-ADDR to the row decoder 120, and a column address Y-ADDR to the input/output circuit 130. However, the present disclosure is not limited thereto, and the control logic 150 may further provide other control signals to the voltage generator 140, the row decoder 120, and the input/output circuit 130.

The control logic 150 may include a program controller 160 controlling programming of the memory cell array 110 according to a program sequence according to a programming method of the present disclosure.

The program controller 160 may control a program operation of the memory device 100. In some embodiments, the program controller 160 may set voltage levels of a plurality of driving voltage respectively corresponding to a plurality of program states. A plurality of driving voltages may include program voltages respectively corresponding to a plurality of program states, verification voltages, offset voltages, and compensation voltages according to a program speed of a word line (e.g., a program speed of each of memory cells connected to the word line).

In some embodiments, the program controller 160 may apply a test program voltage to the memory cell array 110, and determine a Gaussian-shaped threshold voltage distribution of memory cells based on at least one read voltage. The program controller 160 may set control signals used to group memory cells to be programmed, into groups according to program speed during a programming operation, based on a threshold voltage distribution of the memory cells, that is, may set signals such as at least one verification voltage or a signal for setting a sensing time in a verify operation. In addition, the program controller 160 may set a voltage level of a program voltage set corresponding to respective program states (for example, a primary program voltage and a plurality of secondary program voltages).

In some embodiments, the program controller 160 may detect a program speed of each word line before programming memory cells to respective program states, for example, when performing programming to a previous state (e.g., pre-programmed state or an erased state), and set a compensation voltage for each word line based on a program speed. Also, the program controller 160 may adjust a voltage level of a program voltage based on the compensation voltage and the program voltage of the previous state when setting a program voltage for each program state.

In some embodiments, the program controller 160 may control a program sequence according to word lines of the memory cell array 110. When programming operation is performed on memory cells of one word line, the program controller 160 may perform a primary program operation on the memory cells of the word line based on a primary program voltage, and group the memory cells, on which the primary programming operation is performed, into a plurality of cell groups according to their program speeds, and perform a second programming operation on the memory cells based on a plurality of second program voltages that are set based on a threshold voltage difference between the plurality of cell groups. The program controller 160 may set a program sequence such that primary programming operation is performed on memory cells of one word line, and then primary programming operation is performed on an adjacent word line to the above one word line, and then a second programming operation is performed on the memory cells of the above word line, so as to prevent coupling effects between adjacent word lines.

When performing programming operation, the memory device 100 according to the present embodiment may program memory cells based on program voltages that are preset according to respective program states. Also, the memory device 100 may group the memory cells into a plurality of cell groups according to their program speeds based on a threshold voltage distribution of a one-shot memory cell, and program each cell group based on program voltages set based on a threshold voltage difference between the plurality of cell groups such that each of the plurality of cell groups having different threshold voltage distribution widths from one another is programmed to a target state. In this manner, the memory device 100 may program the cell groups by applying the same number of times of programming operation with respect to each program state. Accordingly, a programming period of the memory device 100 may be reduced, and a width of a threshold voltage distribution of each program state may be reduced.

In addition, the memory device 100 according to the present embodiment may check a program speed of memory cells of each word line before programming the memory cells to respective program states, and reflect a compensation voltage according to the program speed to thereby reduce a width of a threshold voltage distribution of each program state programmed to the memory cell array.

In addition, when programming memory cells of one word line, the memory device 100 according to the present embodiment may perform primary programming on each of the word line and another word line adjacent to the word line by applying a primary program voltage corresponding to each word line, and then perform a second programming operation on memory cells of the one word line based on a threshold voltage distribution of one-shot memory cells of the word line, so that coupling effects between the word lines are reduced.

Hereinafter, the memory device 100 and a programming method and an operating method of the memory device 100 according to an embodiment of the present disclosure will be described in more detail.

Figure 2:
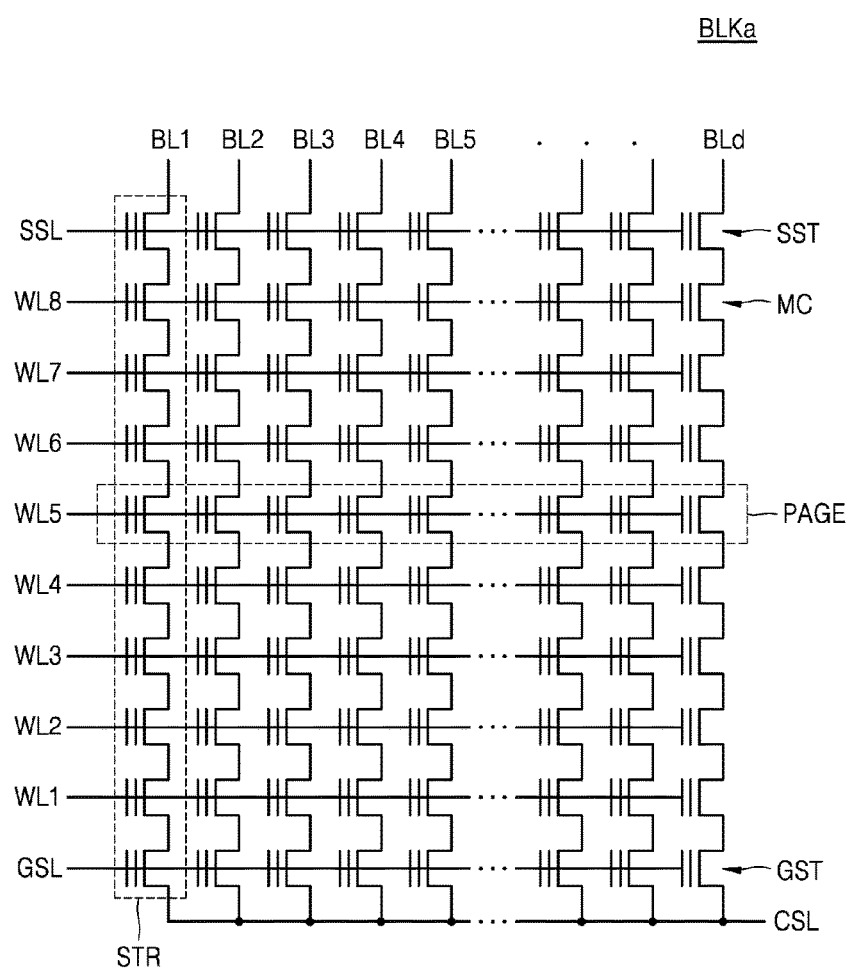
FIG. 2 is a circuit diagram illustrating an example of a memory block according to example embodiments of the present disclosure.

FIG. 2 is a circuit diagram illustrating a memory block BLKa according to example embodiments of the present disclosure.

Referring to FIG. 2, the memory block BLKa may be a horizontal NAND flash memory. The memory block BLKa may include d (d is an integer equal to or greater than 2) strings STR including eight memory cells MC that are serially connected. Each string STR may include a string select transistor SST and a ground select transistor GST respectively connected to two ends of the memory cells MC that are serially connected. The number of the strings STR, the number of word lines WL, and the number of bit lines BL may be various according to example embodiments.

In the NAND flash memory device including a memory block having a structure as illustrated in FIG. 2, erasing is performed on each memory block, and a programming operation may be performed in units of pages respectively corresponding to word lines WL1 through WL8. In an embodiment, when a memory cell MC is a SLC, one page PAGE may correspond to each word line. In another embodiment, when a memory cell MC is a MLC or a TLC, a plurality of pages PAGE may correspond to each word line.

Figure 3:
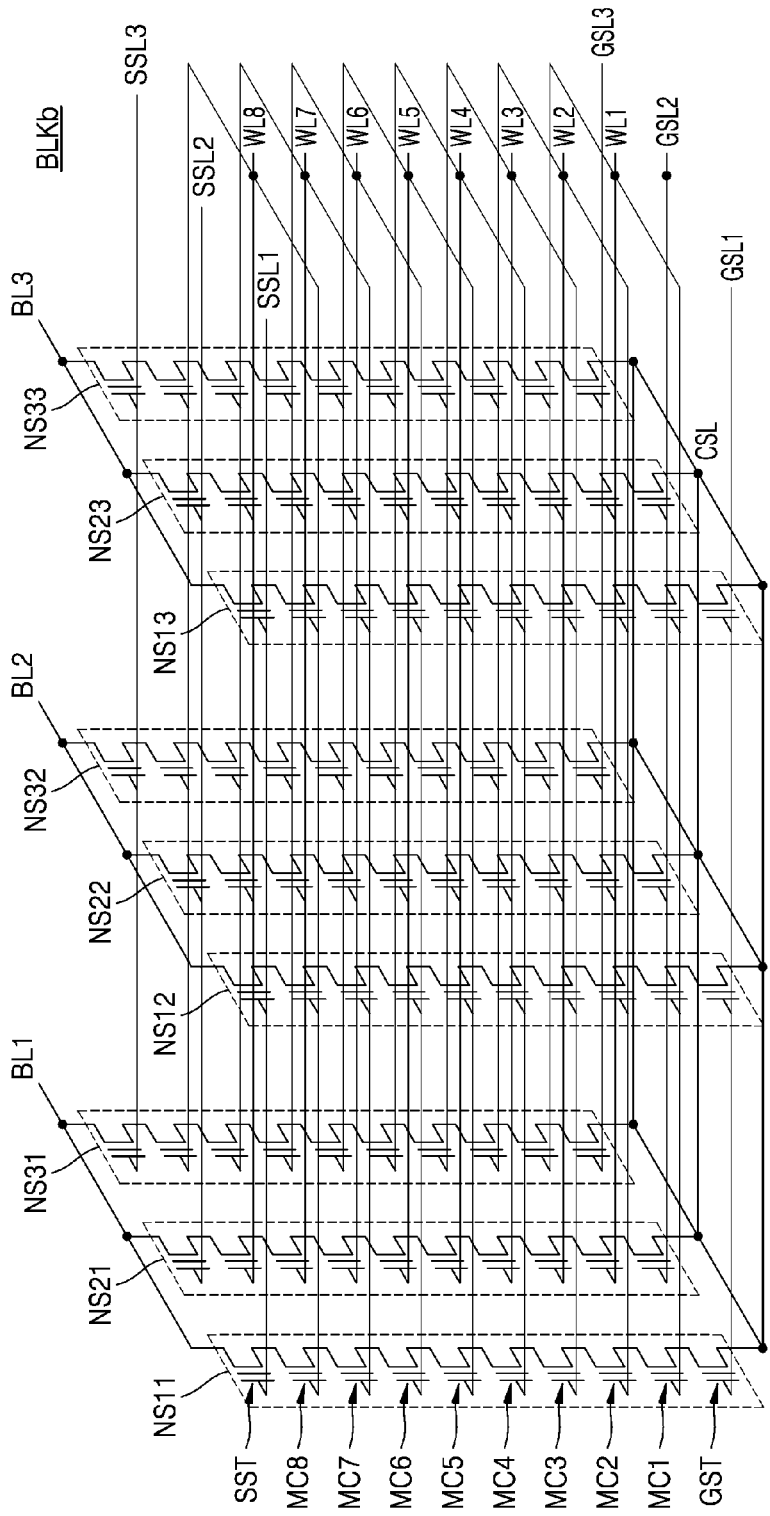
FIG. 3 is a circuit diagram illustrating a memory block according to example embodiments of the present disclosure.

FIG. 3 is a circuit diagram illustrating a memory block BLKb according to example embodiments of the present disclosure.

Referring to FIG. 3, the memory block BLKb may be a vertical NAND flash memory. The memory block BLKb may include a plurality of NAND strings NS11 through NS33, a plurality of word lines WL1 through WL8, a plurality of bit lines BL1 through BL3, ground select lines GSL1, GLS2, and GSL3, a plurality of string select lines SSL1 through SSL3, and a common source line CSL. Here, the numbers of NAND strings, word lines, bit lines, ground select lines, and string select lines may be various according to example embodiments.

NAND strings NS11, NS21, and NS31 may be provided between a first bit line BL1 and the common source line CSL, and NAND strings NS12, NS22, and NS32 may be provided between a second bit line BL2 and the common source line CSL, and NAND strings NS13, NS23, and NS33 may be provided between a third bit line BL3 and the common source line CSL. Each NAND string (for example, the NAND string NS11) may include string select transistor SST, a plurality of memory cells MC1 through MC8, and a ground select transistor GST that are serially connected to one another. Hereinafter, a NAND string will be referred to as a string for convenience.

Strings that are connected in common to one bit line form a column. For example, the strings NS11, NS21, and NS31 connected in common to the first bit line BL1 may correspond to a first column, and the strings NS12, NS22, and NS32 connected in common to the second bit line BL2 may correspond to a second column, and the strings NS13, NS23, and NS33 connected in common to the third bit line BL3 may correspond to a third column.

Strings that are connected to one string select line form a row. For example, the strings NS11, NS12, and NS13 connected to a first string select line SSL1 may correspond to a first row, and the strings NS21, NS22, and NS23 connected to a second string select line SSL2 may correspond to a second row, and the strings NS31, NS32, and NS33 connected to a third string select line SSL3 may correspond to a third row.

Each of the string select transistors SST is connected to the string select lines SSL1 through SSL3. The plurality of memory cells MC1 through MC8 are respectively connected to the word lines WL1 through WL8. Each of the ground select transistors GST is connected to the ground select lines GSL1, GSL2, and GSL3. Each of the string select transistors SST is connected to bit lines BL1, BL2, and BL3, and each of the ground select transistors GST is connected to the common source line CSL.

Figure 4:
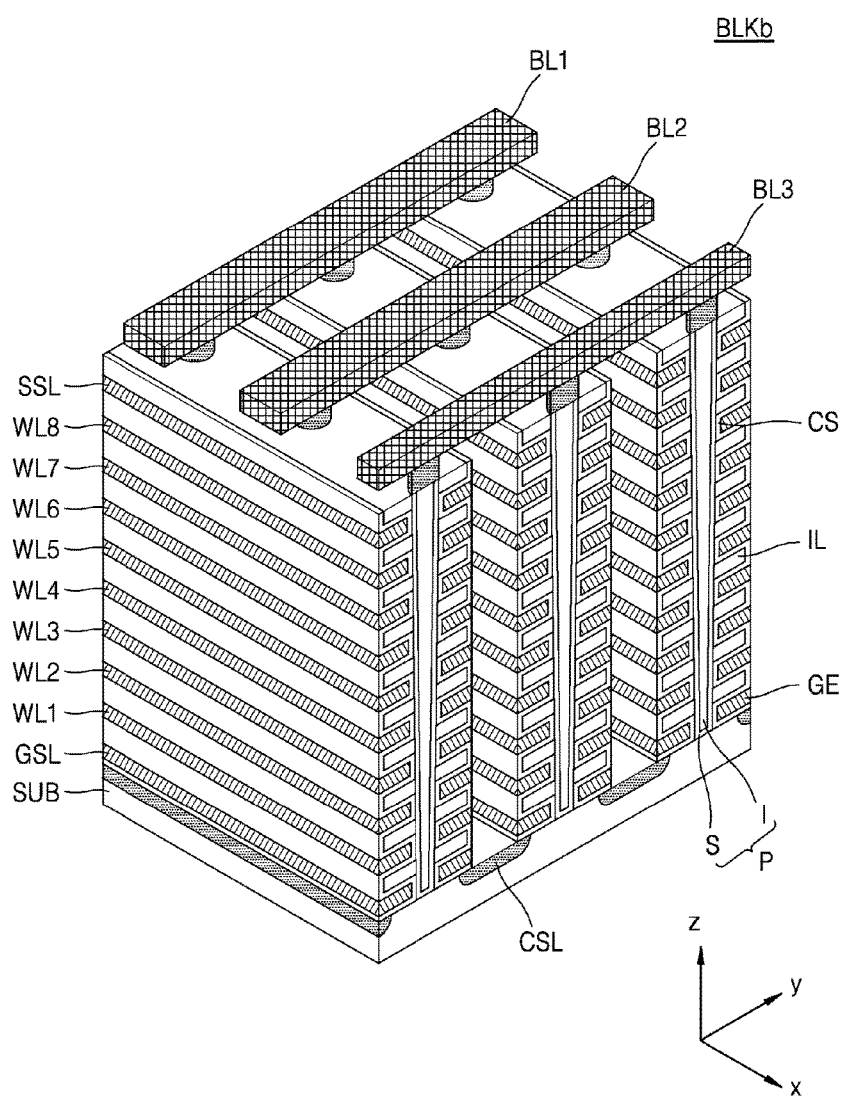
FIG. 4 is a perspective view of a memory block according to the circuit diagram of FIG. 3.

Word lines (e.g., WL1) at the same height are connected to each other in common and the string select lines SSL1 through SSL3 are separated from one another. For example, when programming memory cells connected to the first word line WL1 and belonging to the strings NS11, NS12, and NS13, the first word line WL1 and the first string select line SSL1 may be selected. According to an embodiment, as illustrated in FIG. 4, the ground select lines GSL1, GSL2, and GSL3 may be separated from one another. In another embodiment, the ground select lines GSL1, GSL2, and GSL3 may be connected to one another.

FIG. 4 is a perspective view of the memory block BLKb according to the circuit diagram of FIG. 3.

Referring to FIG. 4, the memory block BLKb is formed vertically with respect to a substrate SUB. The substrate SUB may have a first conductivity type (for example, a p-type), and may extend along a first direction (for example, a x-direction) on the substrate SUB, and a common source line CSL doped with impurities of a second conductivity type (for example, an n-type) may be provided in the substrate SUB. The common source line CSL may function as a source region via which a current is supplied to vertical-type memory cells.

A plurality of insulation layers IL extending along a second direction (for example, a y-direction) are sequentially provided on the substrate SUB between adjacent two common source lines CSL in a third direction (for example, a z-direction). The plurality of insulation layers IL are spaced apart from one another in the third direction by a predetermined distance. For example, the plurality of insulation layers IL may include an insulation material such as a silicon oxide.

Channels holes that are sequentially arranged in the first direction may be formed above the substrate SUB between two adjacent common source lines CSL. The channel holes may pass through the plurality of insulation layers IL in the third direction. The channel holes may have a cup shape extending in a vertical direction (or a cylinder shape with a stopped bottom). Hereinafter, the channel holes will be referred to as pillars. A plurality of pillars P may pass through the plurality of insulation layers IL to contact the substrate SUB. In detail, a surface layer S of each pillar P may include a silicon material of a first type, and may function as a channel region. Meanwhile, an internal layer I of each pillar P may include an insulation material such as a silicon oxide or an air gap.

In a region between two adjacent common source lines CSL, a charge storage layer CS is provided along the insulation layers IL, the pillars P, and an exposed surface of the substrate SUB. For example, the charge storage layer CS may have an oxide-nitride-oxide (ONO) structure. Also, a gate electrode GE may be provided on an exposed surface of the charge storage layer CS in a region between two adjacent common source lines CSL.

Drains or drain contacts are provided on the plurality of pillars P. For example, the drains or the drain contacts may include a silicon material doped with impurities having a second conductivity type (e.g., n-type). Bit lines BL that extend in the second direction (for example, the y-direction) and are spaced apart from one another by a predetermined distance may be provided on the drains or the drain contacts.

A memory block according to an embodiment is described with reference to FIG. 4. However, the memory block is not limited thereto and may have other various structures.

Figure 5A:
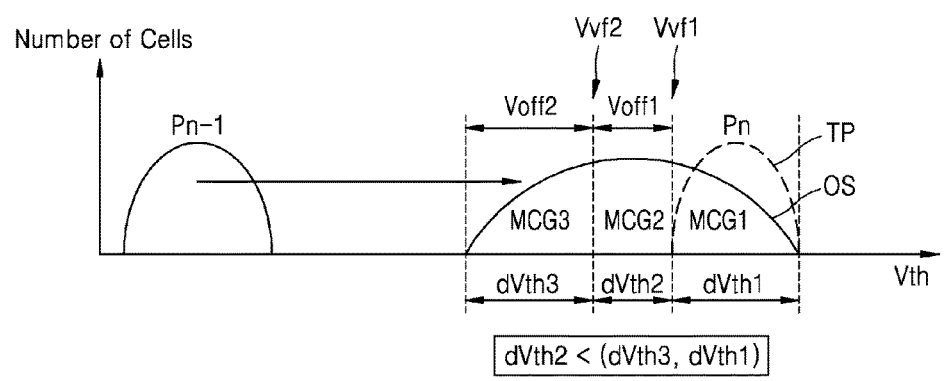
FIGS. 5A and 5B are diagrams illustrating a method of operating a memory device according to example embodiments of the present disclosure.
Figure 5B:
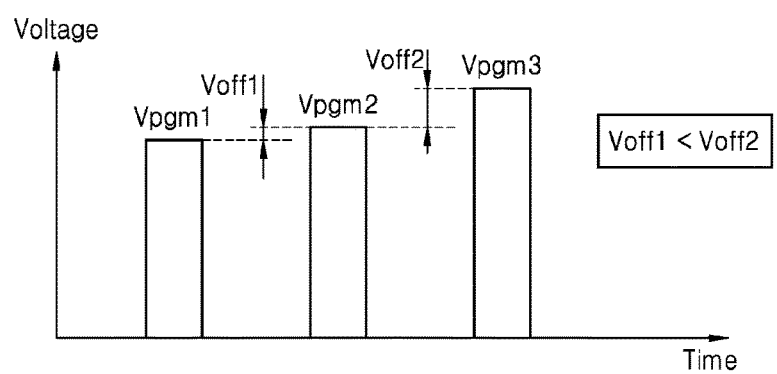

FIGS. 5A and 5B are diagrams illustrating a method of operating a memory device according to example embodiments of the present disclosure. FIG. 5A illustrates a method of grouping memory cells into a plurality of cell groups according to their program speeds based on a one-shot distribution of the memory cells, and FIG. 5B illustrates a program voltage applied to a word line of a plurality of cell groups divided according to their program speeds.

A one-shot distribution refers to a distribution of threshold voltages of memory cells generated when one program pulse voltage is applied to a selected word line. Referring to FIG. 5A, when a program pulse voltage is applied to a word line, a threshold voltage distribution of memory cells connected to the word line, that is, a one-shot distribution, may have a Gaussian distribution.

According to an example method of operating a memory device, that is, a programming method, memory cells are grouped into a plurality of cell groups (e.g., first through third cell groups MCG1, MCG2, and MCG3) according to their program speeds based on a one-shot distribution OS of the memory cells formed based on a primary program voltage, which is, for example, a first program voltage Vpgm1. Then the memory cells may be programmed to a target program state Pn based on a plurality of secondary program voltages, for example, a second program voltage Vpgm2 and a third program voltage Vpgm3, set based on threshold voltage differences between the plurality of cell groups MCG1, MCG2, and MCG3 or threshold voltage ranges dVth1, dVth2, and dVth3 (also referred to as "threshold voltage distribution widths") of the plurality of cell groups MCG1, MCG2, and MCG3. In a certain embodiment, the threshold voltage ranges dVth1, dVth2, and dVth3 of the plurality of cell groups MCG1, MCG2, and MCG3 may be set to be different from one another. In a certain embodiment, a threshold voltage range dVth2 of the second cell group MCG2 may be set to be different from dVth1 and dVth3 of the first and third cell groups MCG1 and MCG3. In an embodiment, each of the threshold voltage ranges dVth1, dVth2, and dVth3 may be set based on the number of memory cells included in a threshold voltage range of each cell group. For example, each of the threshold voltage ranges dVth1, dVth2, and dVth3 may be set to be inversely proportional to the number of memory cells (hereinafter referred to as a unit cell number) included in a unit threshold voltage range of the one-shot distribution. According to the one-shot distribution of a Gaussian shape illustrated in FIG. 5A, a unit cell number of the second cell group MCG2 included in a middle range of the one-shot distribution may be greater than a unit cell number of the first cell group MCG1 or a unit cell number of the third cell group MCG3 in edge ranges of the one-shot distribution. Thus, in a certain embodiment, the threshold voltage range dVth2 of the second cell group MCG2 may be set to be narrower than the threshold voltage range dVth1 of the first cell group MCG1 or the threshold voltage range dVth3 of the third cell group CMG3.

Offset voltages Voff1 and Voff2 between program voltages Vpgm1, Vpgm2, and Vpgm3, that is, a voltage increment may be set based on the threshold voltage differences between the plurality of cell groups MCG1, MCG2, and MCG3 or the threshold voltage ranges dVth1, dVth2, and dVth3 of the plurality of cell groups MCG1, MCG2, and MCG3. For example, a first offset voltage Voff1 and a second offset voltage Voff2 may be set based on the threshold voltage range dVth2 of the second cell group MCG2 and the threshold voltage range dVth3 of the third cell group MCG3. In an embodiment, the first offset voltage Voff1 and the second offset voltage Voff2 may be proportional to the threshold voltage range dVth2 of the second cell group MCG2 and the threshold voltage range dVth3 of the third cell group MCG3. In an embodiment, the first offset voltage Voff1 and the second offset voltage Voff2 may be respectively equal to the threshold voltage ranges dVth2 and dVth3. As the threshold voltage range dVth3 is broader than the threshold voltage range dVth2, the second offset voltage Voff2 may be greater than the first offset voltage Voff1.

The primary program voltage, for example, the first program voltage Vpgm1, may be a voltage that is preset such that at least some of the memory cells, for example, memory cells having a relatively high program speed, are included in a target distribution TP in a target program state Pn. In an embodiment, the first program voltage Vpgm1 may be a voltage that is preset such that memory cells of an uppermost cell group of the one-shot distribution, for example, the first cell group MCG1, are included in the target distribution TP.

Figure 6:
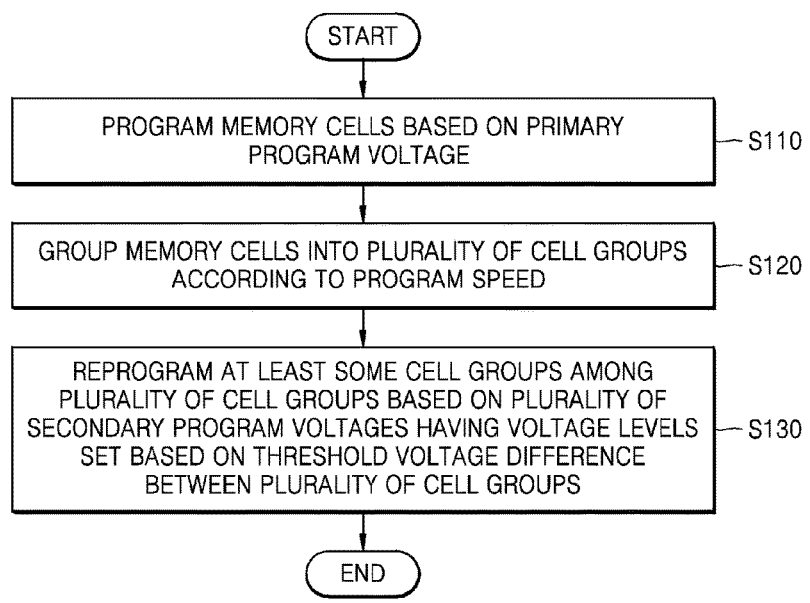
FIG. 6 is a flowchart of a method of operating a memory device according to an embodiment of the present disclosure.

FIG. 6 is a flowchart of a method of operating a memory device according to an embodiment of the present disclosure. A method of programming memory cells to one of a plurality of program states according to the method of operating a memory device according the embodiment of the present disclosure will be described with reference to FIGS. 5A, 5B, and 6.

Referring to FIG. 6, memory cells may be programmed based on the primary program voltage in operation S110. The primary program voltage includes the first program voltage Vpgm1. A primary programming operation is performed by applying the first program voltage Vpgm1 to memory cells of a previous state Pn−1 (or an erased state). A unit of memory cells to be programmed based on a single program voltage may be a word line or a page. Some of the memory cells having a relatively high program speed may be included in the target distribution TP after the primary programming operation is performed.

For example, when memory cells are programmed to a first program state, a primary program voltage that is preset according to the first program state, that is, the first program voltage Vpgm1 may be applied to a word line of the memory cells. Accordingly, the memory cells may be roughly programmed to the first program state. Some of the memory cells, for example, memory cells having a relatively high program speed may be included in a target distribution of the first program state.

In operation S120, the memory cells, on which the primary programming operation is performed, may be read and verified to be grouped into a plurality of cell groups according to their program speeds, based on threshold voltages of the memory cells. The memory cells may be grouped into, for example, at least three cell groups.

As the primary programming operation is performed, a one-shot distribution of the memory cells is created, and the memory cells may be read and verified to be grouped into a plurality of cell groups. While the memory cells are grouped into three cell groups in FIG. 5A, the embodiments are not limited thereto. The memory cells may also be grouped into more than three cell groups.

When memory cells are MLCs each storing 2 bit-data, the memory cells may be grouped into three cell groups. In another embodiment, when memory cells are MLCs each storing 3 bit-data, the memory cells may be grouped into five cell groups. However, the embodiments are not limited thereto, and the number of cell groups may be set based on a width of a target distribution of a program state. For example, the number of cell groups corresponding to a relatively narrow target distribution width of a program state may be greater than the number of cell groups corresponding to a relatively broad target distribution width of a program state.

Meanwhile, in operation 120, threshold voltage ranges of the plurality of cell groups may be set to be different from one another. For example, from among the plurality of cell groups, a threshold voltage range of a cell group corresponding to a middle range of a distribution of memory cells may be smaller than threshold voltage ranges of other cell groups. For example, threshold voltage ranges of cell groups corresponding to an upper area or a lower area of a distribution of memory cells may be set to be broader than threshold voltage ranges of other memory cells.

For example, as illustrated in FIG. 5A, from among the first through third cell groups MCG1, MCG2, and MCG3, the threshold voltage range dVth2 of the second cell group MCG2 corresponding to the middle range of the distribution of the memory cells may be set to be narrower than the threshold voltage range dVth1 of the first cell group MCG1 or the threshold voltage range dVth3 of the third cell group MCG3 corresponding to the edge ranges of the distribution.

Meanwhile, the memory cells may be grouped into a plurality of cell groups by verifying the memory cells based on a preset verification voltage. The verification voltage may be set such that the plurality of cell groups have different threshold voltage ranges from one another. The verification voltage may be set based on a program state of memory cells according to one-shot programming (for example, a distribution range of a one-shot distribution, a location of a distribution, or the like) and threshold voltage ranges of a plurality of cell groups in a manufacturing process of a memory device, in an initialization operation of a memory device, or in a training operation.

For example, memory cells may be grouped into a plurality of cell groups by verifying the memory cells based on a first verification voltage Vvf1 and a second verification voltage Vvf2. A difference between the first verification voltage Vvf1 and the second verification voltage Vvf2 may be proportional to the threshold voltage range dVth2 of the second cell group MCG2.

According to an embodiment, by sensing memory cells twice at different times based on one verification voltage, the memory cells may be grouped into three cell groups through one read and verification operation. This may be referred to as a double sensing operation. Here, an interval between a first sensing time and a second sensing time may be set based on the threshold voltage range dVth2 of the second cell group MCG2. For example, when the threshold voltage range of the second cell group MCG2 is 1 volt (V), the above interval may be shorter than an internal when the threshold voltage range of the second cell group MCG2 is 0.8V.

Next, in operation S130, at least some of the plurality of cell groups may be reprogrammed based on the secondary program voltage whose level is set based on the threshold voltage difference between the plurality of cell groups, for example, based on the second program voltage Vpgm2 and the third program voltage Vpgm3. That is, from among the plurality of cell groups, cell groups except a cell group that is included in a target distribution TP may be reprogrammed. For example, when the first cell group MCG1 is included in the target distribution TP, and other cell groups, that is, the second and third cell groups MCG2 and MCG3, are outside the range of the target distribution TP, the second and third cell groups MCG2 and MCG3 may be reprogrammed to a target state (e.g., Pn), except the first cell group MCG1 which is included in the target distribution TP. The second and third cell groups MCG2 and MCG3 may be reprogrammed based on a plurality of secondary program voltages, that is, the second program voltage Vpgm2 and the third program voltage Vpgm3. The second program voltage Vpgm2 having a higher voltage level than the first program voltage Vpgm1 by a first offset voltage Voff1 may be applied to a word line of the second and third cell groups MCG2 and MCG3. Accordingly, memory cells of the second cell group MCG2 may be included in the target distribution TP. Next, the third program voltage Vpgm3 having a voltage level increased from the second program voltage Vpgm2 by a second offset voltage Voff2 may be applied to the word line of the third cell group MCG3. Accordingly, memory cells of the third cell group MCG3 may be included in the target distribution TP.

In example embodiments, when the second program voltage Vpgm2 having a higher voltage level than the first program voltage Vpgm1 by the first offset voltage Voff1 is applied to the word line of the second and third cell groups MCG2 and MCG3 an inhibit voltage is applied to bit lines connected to the first cell group MCG1 such that memory cells of the first cell group MCG1 may not be programmed. In addition, when the third program voltage Vpgm3 having a voltage level increased from the second program voltage Vpgm2 by the second offset voltage Voff2 is applied to the word line of the third cell group MCG3 an inhibit voltage is applied to bit lines connected to the first and second cell groups MCG1 and MCG2 such that memory cells of the first and second cell groups MCG1 and MCG2 are not programmed.

According to other example embodiments, a second programming operation may be performed by applying a second program voltage Vpgm2 that has a higher voltage level than the first program voltage Vpgm1 by a sum of the first offset voltage Voff1 and the second offset voltage Voff2, to the second cell group MCG2 and the third cell group MCG3. Here, a program speed of the second cell group MCG2 may be slowed by applying a forcing voltage to a bit line of the memory cells of the second cell group MCG2. A voltage level of the forcing voltage may be equal to a level of the second offset voltage Voff2. Accordingly, memory cells of the second cell group MCG2 and the third cell group MCG3 may be included in the target distribution TP after the second programming operation is performed.

In example embodiments, when the second program voltage Vpgm2 having a higher voltage level than the first program voltage Vpgm1 by a sum of the first offset voltage Voff1 and the second offset voltage Voff2 is applied to the word line of the second and third cell groups MCG2 and MCG3 an inhibit voltage is applied to bit lines connected to the first cell group MCG1 such that memory cells of the first cell group MCG1 may be not programmed.

Figure 7A:
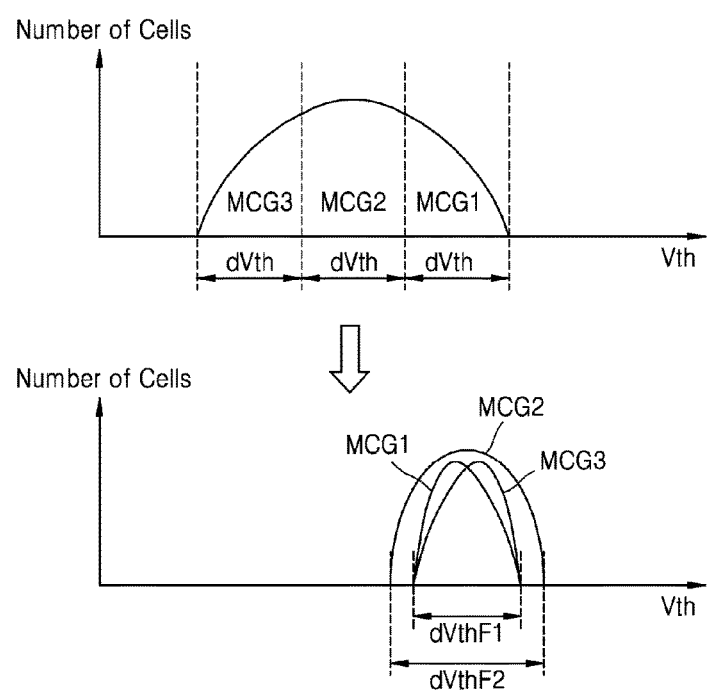
FIGS. 7A and 7B are graphs showing a distribution of memory cells according to setting of threshold voltage ranges of cell groups.
Figure 7B:
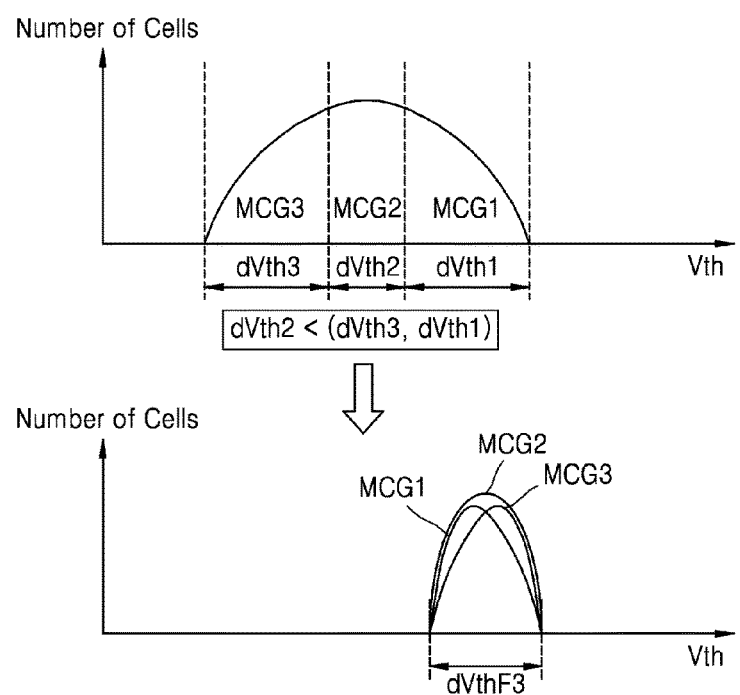

FIGS. 7A and 7B are graphs showing a distribution of memory cells according to setting of threshold voltage ranges of cell groups. FIG. 7A illustrates cell groups having same threshold voltage ranges, and FIG. 7B illustrates cell groups having different threshold voltage ranges from one another according to example embodiments.

Referring to FIG. 7A, for example, when programming memory cells by using an Incremental Step Pulse Programming (ISPP) method, the memory cells may be grouped into a plurality of cell groups having the same threshold voltage ranges (e.g., dVth). As a voltage pulse increases to a predetermined level in each programming operation, threshold voltage ranges (or distribution widths) of the cell groups programmed to a target program state in respective programming operations may also be the same to one another. In this case, a number of memory cells of a second cell group MCG2 may be greater than a number of memory cells of a first cell group MCG1 or a third cell group MCG3. Accordingly, a threshold voltage range dVthF2 of a final distribution of the second cell group MCG2 may be broader than a threshold voltage range dVthF1 of a final distribution of the first cell group MCG1 or the third cell group MCG3. As described above, when programming memory cells by grouping the memory cells into a plurality of cell groups having the same threshold voltage ranges, threshold voltage ranges of final threshold distributions of the cell groups may be different from one another. The final threshold distributions of the cell groups are to be included in a target distribution of a target program state. Thus, the number of times of programming may be increased to adjust a final distribution of a cell group having a broadest distribution among the cell groups, to the target distribution.

In example embodiments, as illustrated in FIG. 7B, when memory cells are grouped into a plurality of cell groups based on varying threshold voltage ranges, and the threshold voltage ranges of the cell groups are set to be inversely proportional to the number of unit cells of the respective groups, a difference of the number of memory cells included in the respective cell groups may be small.

When the plurality of cell groups are programmed based on program voltages having voltage levels that are set based on the threshold voltage ranges described above, threshold voltage ranges dVthF3 of final distributions of the cell groups may be similar to one another. Compared to the programming method of FIG. 7A, a maximum value of threshold voltage ranges dVthF3 of final distributions of the cell groups may be narrower than a maximum value dVthF2 of the threshold voltage ranges of the final distributions of the cell groups of FIG. 7A. Thus, when memory cells are programmed based on threshold voltage ranges of the cell groups set to be different from one another according to the programming method of the embodiment of the present disclosure, the number of times of programming operations may be reduced or a width of threshold voltage distributions of memory cells on which programming operation is completed may be reduced.

FIGS. 8A through 8D are graphs showing a programming method in a stepwise manner according to example embodiments of the present disclosure. FIG. 9 is a waveform diagram of a voltage applied to a word line connected to memory cells to be programmed according to the programming method of FIG. 8.

Figure 8A:
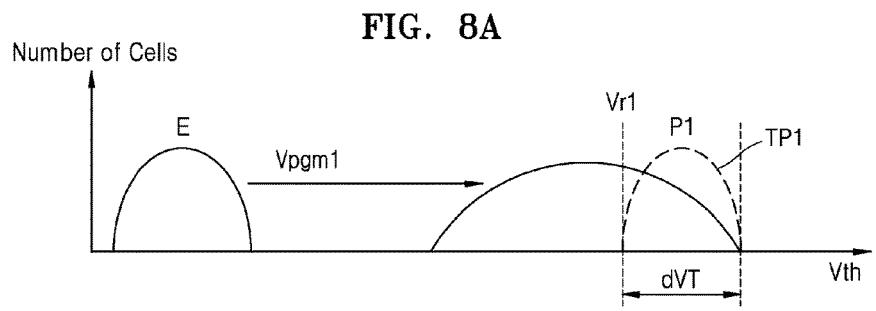
FIGS. 8A through 8D are graphs showing a programming method in a stepwise manner, according to example embodiments of the present disclosure.
Figure 9:
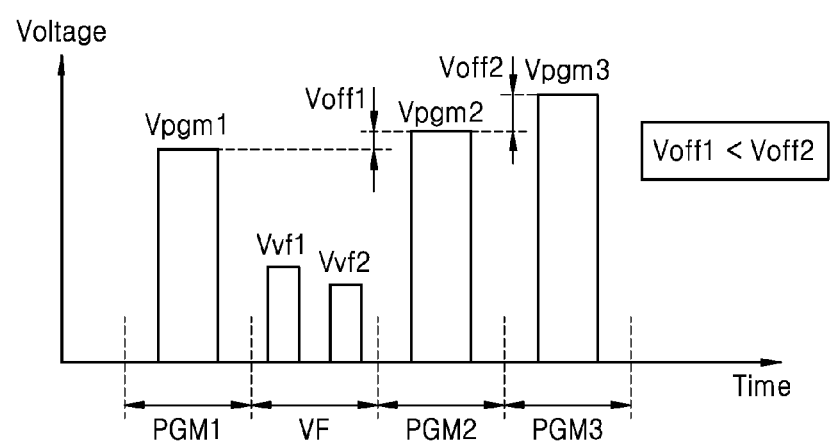
FIG. 9 is a waveform diagram of a voltage applied to a word line connected to a memory cell programmed according to the programming method of FIG. 8.

Referring to FIGS. 8A and 9, a primary program voltage, that is, a first program voltage Vpgm1 is applied to a word line of memory cells in an erased state E (or, a previous state). For example, the first program voltage Vpgm1 is applied to a word line connected to the memory cells. Accordingly, a one-shot distribution of the memory cells is formed according to the first program voltage Vpgm1. The one-shot distribution may have a Gaussian shape. An upper area of the one-shot distribution (e.g., a right-side area to the one-shot distribution) may be included in a target distribution TP1 of a first program state P1 (e.g., a target state). That is, in the one-shot distribution of the memory cells, a threshold voltage of some memory cells in the upper area may be included within a threshold voltage range dVT of the target distribution TP1.

Figure 8B:
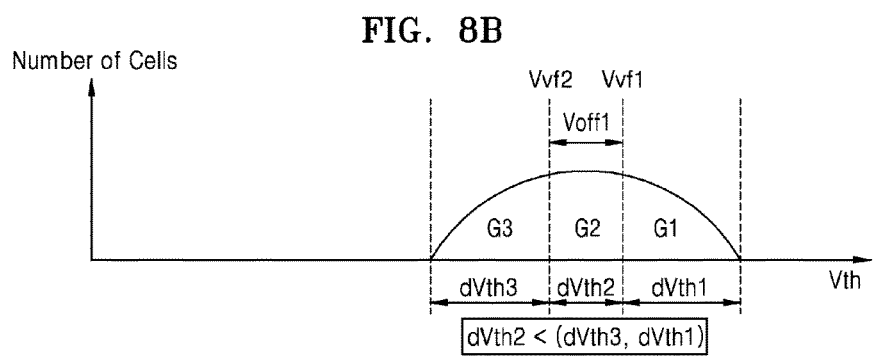

Referring to FIG. 8B, for example, the memory cells are grouped, based on threshold voltages of the memory cells, into three, first through third cell groups G1, G2, and G3 distinguished according to their program speeds (e.g., program speeds of the memory cells of the word line). The memory cells may be grouped into the three cell groups by verifying the memory cells. According to an embodiment, by verifying the memory cells based on a first verification voltage Vvf1 and a second verification voltage Vvf2, the memory cells may be grouped into three cell groups. In an embodiment, a voltage difference between the first verification voltage Vvf1 and the second verification voltage Vvf2 may be equal to a threshold voltage range dVth2 of the second cell group G2. In an embodiment, the first verification voltage Vvf1 may be equal to a read and verification voltage Vr1 with respect to the first program state P1, which is used to verify whether memory cells are properly programmed to the first program state P1.

The threshold voltage ranges dVth1, dVth2, and dVth3 of the first through third cell groups G1, G2, and G3 may be set based on respective unit threshold voltage ranges of the cell groups. For example, the threshold voltage ranges dVth1, dVth2, and dVth3 may be set to be inversely proportional to the number of memory cells included in respective unit threshold voltage ranges of the cell groups (hereinafter referred to as "unit cell numbers"). The threshold voltage range dVth2 of the second cell group G2 may be narrower than the threshold voltage range dVth1 of the first cell group G1 or the threshold voltage range dVth3 of the third cell group G3.

Figure 8C:
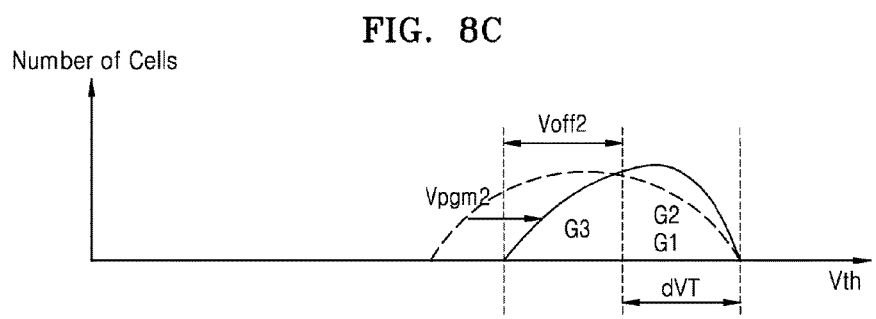

A distribution of the memory cells may be changed to a state as illustrated in FIG. 8C when a second program voltage Vpgm2, among a plurality of secondary program voltages, is applied to the word line of memory cells of the second cell group G2 and the third cell group G3. A voltage level of the second program voltage Vpgm2 corresponds to a voltage level of the first program voltage Vpgm1, to which a first offset voltage Voff1 is added. The first offset voltage Voff1 may be equal to the threshold voltage range dVth2 of the second cell group G2.

As the second program voltage Vpgm2 is applied to the word line of the memory cells of the second cell group G2 and the third cell group G3 except to the first cell group G1 which is already included in the target distribution TP1, threshold voltage distributions of the second cell group G2 and the third cell group G3 are shifted to the right, and the second cell group G2 may now be included in the target distribution TP1. For example, when the second program voltage Vpgm2 is applied to the word line of the second and third cell groups G2 and G3, an inhibit voltage is applied to bit lines connected to the first cell group G1 such that memory cells of the first cell group G1 are not programmed.

Figure 8D:
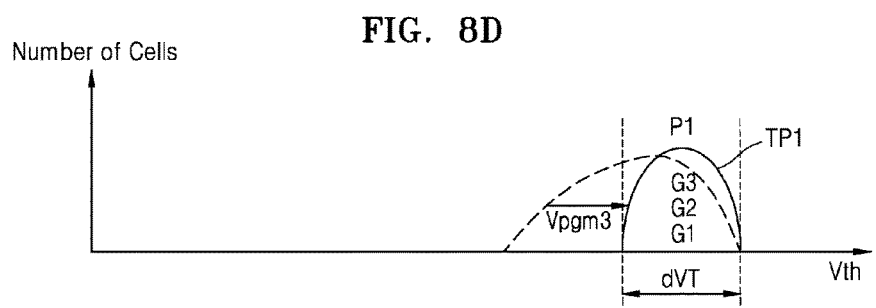

Next, as illustrated in FIG. 8D, a third program voltage Vpgm3, among the plurality of secondary program voltages, is applied to the word line of the memory cells of the third cell group G3. For example, when the third program voltage Vpgm3 is applied to the word line of the third cell group MCG3 an inhibit voltage is applied to bit lines connected to the first and second cell groups G1 and G2 such that memory cells of the first and second cell groups G1 and G2 may not be programmed. A voltage level of the third program voltage Vpgm3 corresponds to a voltage level of the second program voltage Vpgm2, to which a second offset voltage Voff2 is added. The second offset voltage Voff2 may be equal to the threshold voltage range dVth3 of the third cell group G3. Accordingly, a threshold voltage distribution of the third cell group G3 is shifted to the right, and the third cell group G3 may now be included in the target distribution TP1. Thus, the memory cells may be programmed to the first program state P1.

The method of programming memory cells to the first program state P1 is described above with reference to FIGS. 8A to 8D and 9. The above-described method may also be applied to programming memory cells to other program states.

Figure 10:
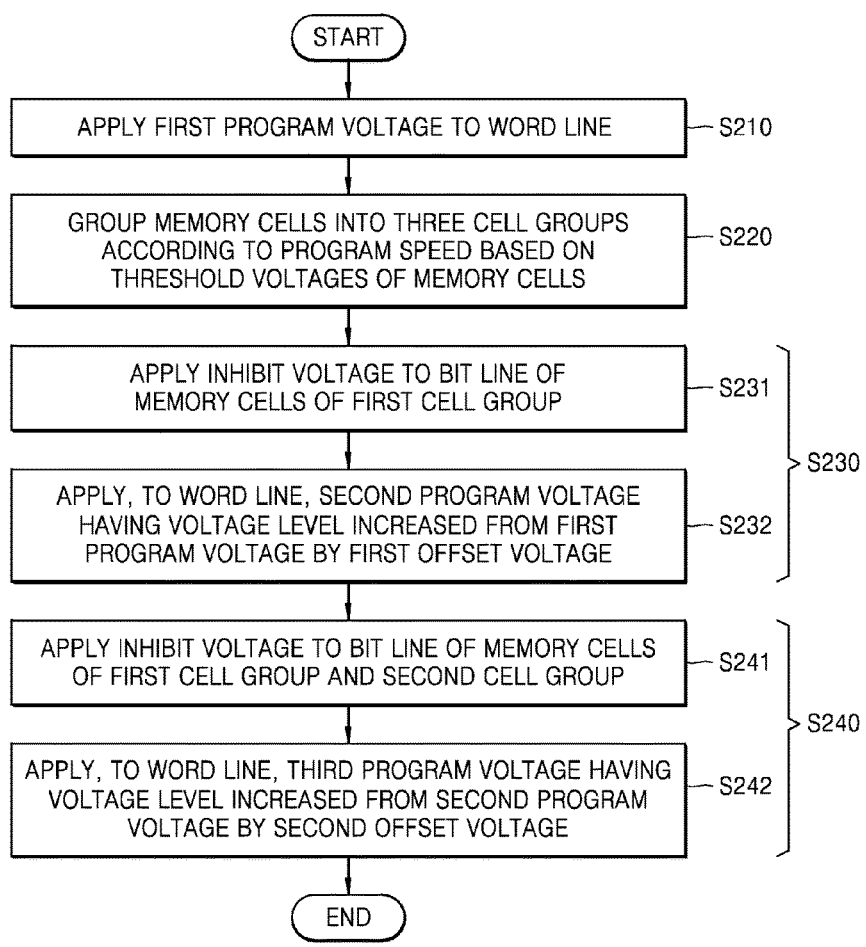
FIG. 10 is a detailed flowchart of a programming method according to example embodiments of the present disclosure.

FIG. 10 is a detailed flowchart of a programming method according to example embodiments of the present disclosure. That is, FIG. 10 is a detailed flowchart of the programming method illustrated in FIGS. 8A to 8D and 9, and details described with reference to FIGS. 8A to 8D and 9 may also apply to the embodiment of FIG. 10.

Referring to FIG. 10, in an operation S210, a first programming operation may be performed by applying a first program voltage (e.g., Vpgm1) to a word line to which memory cells are connected. A portion of a distribution of the memory cells, that is, a distribution of an upper area of a one-shot distribution of the memory cells may be included in a target distribution of a target program state.

The memory cells are grouped into, for example, three cell groups according to their program speeds, based on threshold voltages of the memory cells in an operation S220. The memory cells programmed in the first programming operation may be read and verified based on a preset verification voltage and grouped into three cell groups based on the threshold voltages of the memory cells. A cell group having a relatively high threshold voltage, for example, a first cell group, may include fast cells having a high program speed, and a cell group having a relatively low threshold voltage, for example, a third cell group, may include slow cells having a low program speed. Thus, the memory cells may be grouped into three cell groups according to their program speeds. A threshold voltage range of a cell group corresponding to a middle range of a distribution of memory cells, from among the three cell groups, for example, a threshold voltage range of a second cell group, may be set to be narrower than those of other cell groups, for example, the first cell group or the third cell group.

After the memory cells are grouped into, for example, three cell groups, a second programming operation (S230) and a third programming operation (S240) may be performed.

First, an inhibit voltage is applied to a bit line of the memory cells of the first cell group in an operation S231. A distribution of the first cell group may be included in a target distribution of a target program state (e.g., P1). Thus, a programming operation is not performed on the first cell group anymore. In order to prevent programming on the first cell group, the inhibit voltage may be applied to the bit lines of the memory cells of the first cell group.

Next, a second program voltage (e.g., Vpgm2) may be applied to the word line in an operation S232. The second program voltage corresponds to a voltage level increased from the first program voltage by a first offset voltage, and the first offset voltage may be set based on the threshold voltage range of the second cell group. According to the second programming operation (S230), a distribution of the second cell group may be included in the target distribution of the target program state.

As distributions of the first cell group and the second cell group are included in the target distribution, next, the third programming operation (S240) may be performed on the third cell group.

An inhibit voltage may be applied to bit lines of the memory cells of the first cell group and the second cell group in an operation S241, and a third program voltage (e.g., Vpgm3) is applied to the word line in an operation S242. The third program voltage corresponds to a voltage level increased from the second program voltage by a second offset voltage, and the second offset voltage may be set based on a threshold voltage range of the third cell group. According to the third programming operation (S240), a distribution of the third cell group may be included in the target distribution. Accordingly, programming to one program state may be completed.

Although not illustrated, in example embodiments, after the third operation S240, a verify operation may be performed to determine whether the memory cells are properly programmed to the target program state. When memory cells more than a threshold value are outside a target distribution of the target program state, additional programming may be performed on the memory cells. Alternatively, a page including such memory cells may be determined as failed.

Figure 11A:
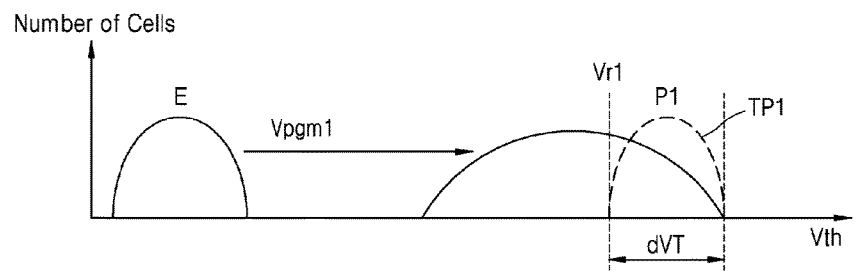
FIGS. 11A through 11C are graphs showing an example of a programming method in a stepwise manner, according to example embodiments of the present disclosure.
Figure 11B:
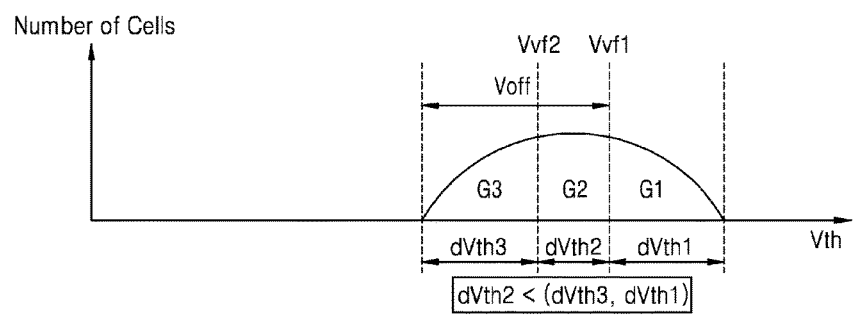
Figure 11C:
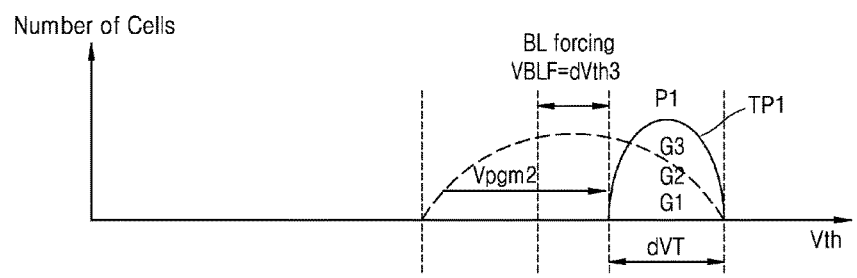
Figure 12:
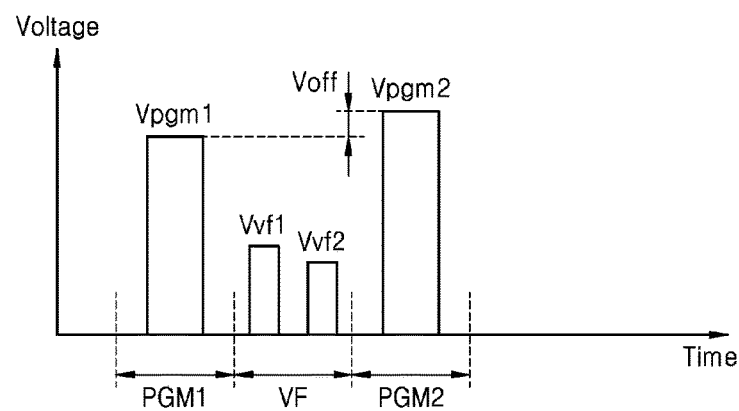
FIG. 12 is a waveform diagram of a voltage applied to a word line connected to a memory cell programmed according to the programming method of FIG. 11.

FIGS. 11A through 11C are graphs showing an example of a programming method in a stepwise manner according to example embodiments of the present disclosure. FIG. 12 is a waveform diagram of a voltage applied to a word line connected to memory cells programmed according to the method of FIGS. 11A to 11C.

Referring to FIGS. 11A and 12, a first programming operation may be performed by applying a primary program voltage, that is, a first program voltage Vpgm1, to a word line of memory cells in an erased state E (or, a previous state). Referring to FIG. 11B, the memory cells are grouped into three, first through third cell groups G1, G2, and G3 according to their program speeds, based on threshold voltages of the memory cells. Operations of FIGS. 11A and 11B are respectively the same as the operations of FIGS. 8A and 8B, and thus, detailed description thereof will be omitted.

A second programming operation may be performed by applying a second program voltage Vpgm2 to the memory cells of the second cell group G2 and the third cell group G3. A distribution of the memory cells is changed to a shape illustrated in FIG. 11C. A voltage level of the second program voltage Vpgm2 corresponds to a voltage level of the first program voltage Vpgm1, to which an offset voltage Voff is added. The offset voltage Voff may be equal to a sum of the threshold voltage range dVth2 of the second cell group G2 and the threshold voltage range dVth3 of the third cell group G3. As the second program voltage Vpgm2 is applied to the word line of the memory cells of the second cell group G2 and the third cell group G3, threshold voltage distributions of the second cell group G2 and the third cell group G3 may be shifted to the right, except the first cell group G1 which is already included in the target distribution TP1. Meanwhile, when the second program voltage Vpgm2 is applied to the word line of the memory cells of the second cell group G2, the second cell group G2 may be overprogrammed. A threshold voltage of a distribution of the memory cells of the second cell group G2 may be higher than a threshold voltage of the target distribution TP1. To prevent this, a forcing voltage VBLF may be applied to bit lines of the memory cells of the second cell group G2 to reduce a program speed of the second cell group G2. For example, a level of the forcing voltage VBLF may be lower than a level of the inhibit voltage. For example, a level of the forcing voltage VBLF may correspond to the threshold voltage level dVth3 of the third cell group G3. Accordingly, as the second programming operation is performed based on the second program voltage Vpgm2 and the forcing voltage VBLF, the second cell group G2 and the third cell group G3 may be included in the target distribution TP1. Thus, the memory cells may be programmed to the first program state P1.

Figure 13:
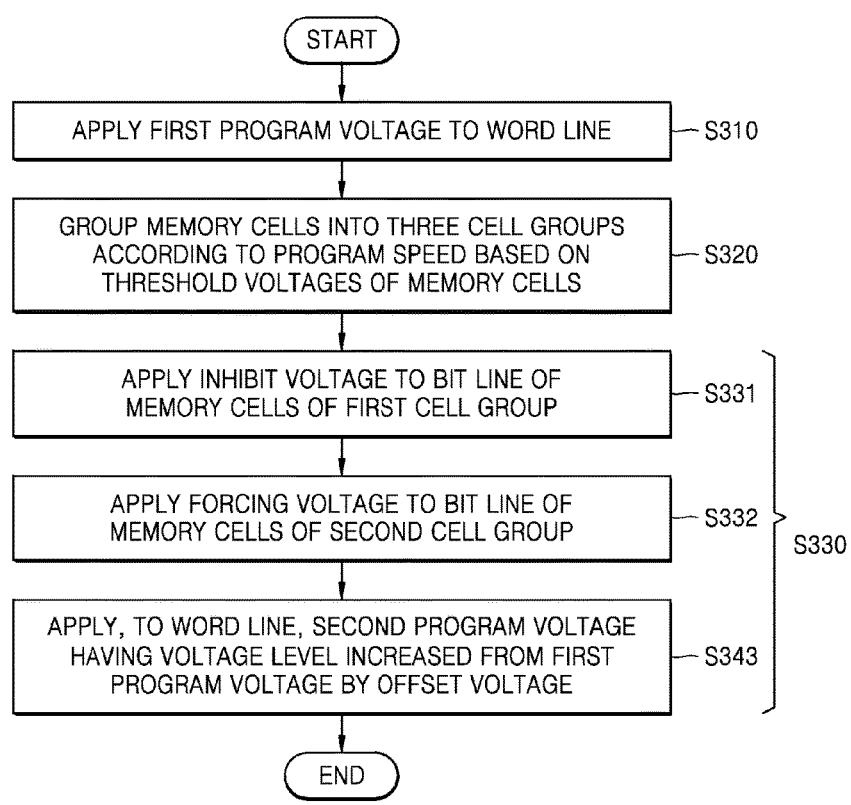
FIG. 13 is a detailed flowchart of a programming method according to example embodiments of the present disclosure.

FIG. 13 is a detailed flowchart of a programming method according to example embodiments of the present disclosure. That is, FIG. 13 is a detailed flowchart of the programming method illustrated in FIGS. 11A to 11C and 12, and detailed description with reference to FIGS. 11A to 11C and 12 may also apply to the embodiment of FIG. 13.

Referring to FIG. 13, in an operation S310, a first programming operation may be performed on memory cells by applying a first program voltage (e.g., Vpgm1) to a word line to which the memory cells are connected, and in an operation S320, the memory cells are grouped into, for example, three cell groups according to their program speeds, based on threshold voltages of the memory cells. The operations S310 and S320 are respectively the same as the operations S210 and S220 of FIG. 10, and thus, detailed description thereof will be omitted.

After grouping the memory cells into three cell groups, a second programming operation (S330) may be performed.

An inhibit voltage is applied to bit lines of memory cells of the first cell group in an operation S331. A distribution of the first cell group may be included in a target distribution in a target program state. Thus, a programming operation on the first cell group is no longer performed. In order to prevent a reprogramming operation on the first cell group, an inhibit voltage may be applied to bit lines of the memory cells of the first cell group.

A forcing voltage is applied to bit lines of memory cells of the second cell group in an operation S332.

Locations and ranges of distributions of the second cell group and the third cell group are different from a position and a range of a distribution with respect to a threshold voltage. In order to program the second cell group and the third cell group to the target state at the same time, the forcing voltage is applied to bit lines of the memory cells of the second cell group having a higher program speed than the third cell group so as to reduce a program speed of the second cell group.

Next, a second program voltage (e.g., Vpgm2) is applied to the word line in an operation S343. The second program voltage may be an increased program voltage, that is, a voltage having a voltage level increased from the first program voltage by an offset voltage, and the offset voltage may be set based on threshold voltage ranges of the second cell group and the third cell group. For example, the offset voltage is equal to a sum of the threshold voltage range of the second cell group and the threshold voltage range of the third cell group.

According to an embodiment, applying of the inhibit voltage (operation S331) and applying of the forcing voltage (operation S332) may be performed at the same time. Furthermore, applying of the inhibit voltage (operation S331), applying of the forcing voltage (operation S332), and applying of the second program voltage (operation S343) may be performed at the same time.

Figure 14A:
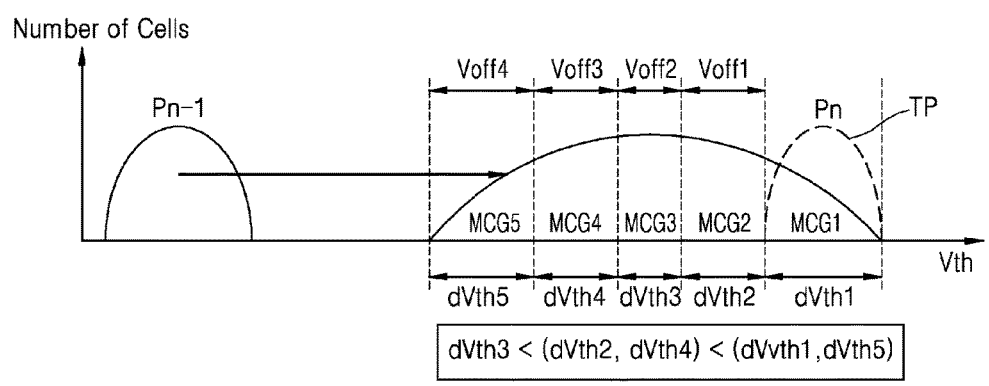
FIGS. 14A and 14B are views illustrating a method of operating a memory device, according to example embodiments of the present disclosure.
Figure 14B:
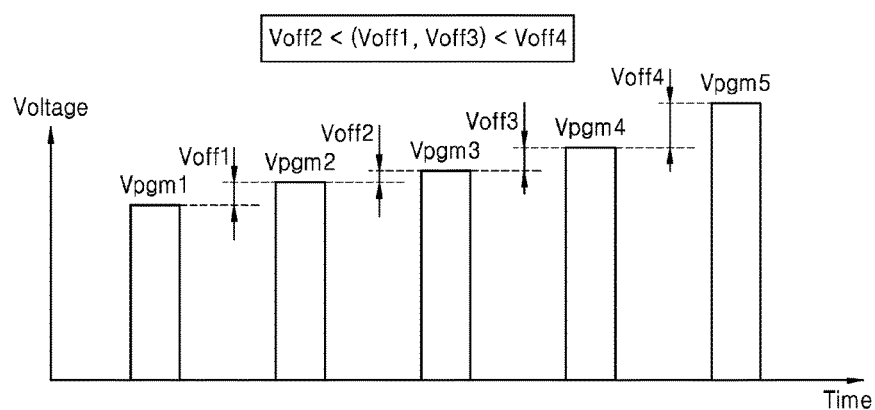

FIGS. 14A and 14B are views illustrating a method of operating a memory device according to example embodiments of the present disclosure. FIG. 14A illustrates a method of grouping memory cells into five cell groups according to their program speeds, based on a one-shot distribution of the memory cells, and FIG. 14B shows program voltages applied to a word line of a plurality of cell groups of FIG. 14A.

Referring to FIG. 14A, for example, memory cells may be grouped into five, first through fifth cell groups MCG1 through MCG5 according to their program speeds, based on a one-shot distribution of the memory cells. Threshold voltage ranges dVth1 through dVth5 of the first through fifth cell groups MCG1 through MCG5 may be different from one another. In example embodiments, at least one of the threshold voltage ranges dVth1 through dVth5 is different from others.

For example, the threshold voltage ranges dVth1 through dVth5 may be set to be inversely proportional to the number of memory cells included in respective unit threshold voltage ranges of the cell groups (hereinafter referred to as a "unit cell number"). According to the illustrated one-shot distribution, a unit cell number of the third cell group MCG3 may be greater than unit cell numbers of other cell groups. Thus, the threshold voltage range dVth3 of the third cell group MCG3 may be set to be narrower than threshold voltage ranges of other cell groups. On the other hand, a unit cell number of an edge area of the one-shot distribution, for example, a unit cell number of the first cell group MCG1 or the fifth cell group MCG5 may be smaller than those of other cell groups. Accordingly, the threshold voltage range dVth1 of the first cell group MCG1 or the threshold voltage range dVth5 of the fifth cell group MCG5 may be set to be broader than threshold voltage ranges of other cell groups.

As described above, the memory cells grouped into the five cell groups MCG1 through MCG5 having different threshold voltage ranges from one another may be reprogrammed to the target program state Pn based on a plurality of secondary program voltages Vpgm2 through Vpgm5 set based on threshold voltage differences between the plurality of cell groups MCG1 through MCG5 or the threshold voltage ranges dVth1 through dVth5 of the plurality of cell groups MCG1 through MCG5.

Referring to FIG. 14B, the first program voltage Vpgm1 may be a voltage that is preset such that at least some of the memory cells are included in a target distribution TP of a target program state Pn. According to an embodiment, the first program voltage Vpgm1 may be a voltage that is preset such that memory cells of an uppermost cell group of the one-shot distribution, that is, memory cells of the first cell group MCG1 are included in the target distribution TP.

The second through fifth program voltage Vpgm2 through Vpgm5 may be voltages having voltage levels that are respectively sequentially increased from a voltage level of the first program voltage Vpgm1. Offset voltages Voff1 through Voff4 between the program voltages Vpgm1 through Vpgm5, that is, voltage increments, may be set based on a threshold voltage difference between threshold voltages of the second through fifth cell groups MCG2 through MCG5 or threshold voltage ranges dVth2 through dVth5 of the second through fifth cell groups MCG2 through MCG5. According to an embodiment, the offset voltages Voff1 through Voff4 may be proportional to the threshold voltage ranges dVth2 through dVth5. According to an embodiment, the offset voltages Voff1 through Voff4 may be respectively equal to the threshold voltage ranges dVth2 through dVth5. In example embodiments, a second offset voltage Voff2 may be relatively low, and a fourth offset voltage Voff4 may be relatively high.

Figure 16:
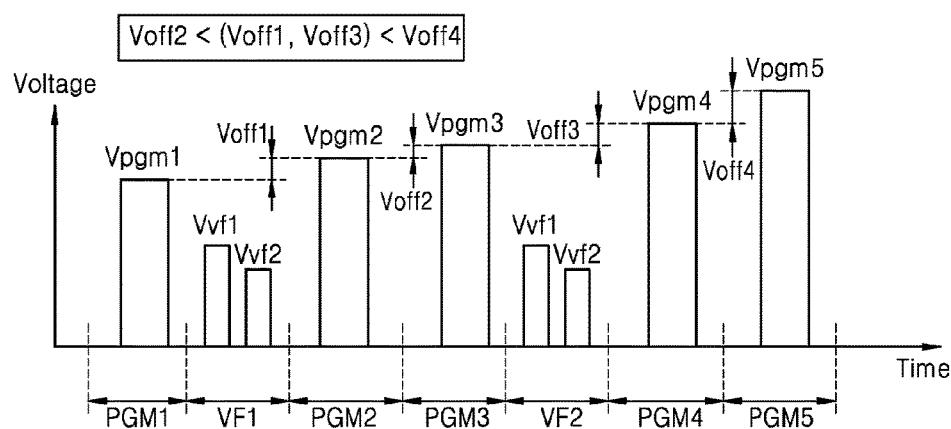
FIG. 16 is a waveform diagram of a voltage applied to a word line connected to a memory cell programmed according to the method of FIG. 15.

FIGS. 15A through 15F are graphs showing a programming method in a stepwise manner according to example embodiments of the present disclosure. FIG. 16 is a waveform diagram of voltages applied to a word line connected to a memory cell programmed according to the programming method of FIG. 15.

Referring to FIGS. 15A and 16, a first programming operation PGM1 is performed. A first program voltage Vpgm1 may be applied to a word line of memory cells of an erased state E (or, a previous state). Accordingly, a one-shot distribution of the memory cells according to the first program voltage Vpgm1 is formed. An upper area of the one-shot distribution (a right-side area to the one-shot distribution) may be included in a target distribution TP1 of a first program state P1.

Referring to FIG. 15B, memory cells are grouped into five, first through fifth cell groups G1 through G5 according to their program speeds, based on threshold voltages of the memory cells. According to an embodiment, memory cells may be read based on at least four verification voltages to group the memory cells into the five cell groups G1 through G5. According to another embodiment, as illustrated in FIG. 16, at least two verify operations VF1 and VF2 may be performed to group the memory cells into the five cell groups G1 through G5.

According to the present embodiment, as illustrated in FIG. 16, description will focus on an embodiment in which the memory cells are grouped into the five groups G1 through G5 by using at least two verify operations VF1 and VF2. In the first verify operation VF1, memory cells are read and verified based on a first verification voltage Vvf1 and a second verification voltage Vvf2 to group memory cells into three cell groups. The memory cells may be grouped into the first cell group G1, the second cell group G2, and the other groups G3, G4, and G5.

Next, a second programming operation PGM2 may be performed. As a second program voltage Vpgm2 is applied to the word line of memory cells of the second cell group G2 and the other cell groups G3 through G5, a distribution of the memory cells is changed to a state as illustrated in FIG. 15C. In example embodiments, when the second program voltage Vpgm2 is applied to the word line of the second through fifth cell groups G2 through G5 an inhibit voltage is applied to bit lines connected to the first cell group G1 such that memory cells of the first cell group G1 are not programmed. A voltage level of the second program voltage Vpgm2 corresponds to a sum of a voltage level of the first program voltage Vpgm1 and a first offset voltage Voff1. The first offset voltage Voff1 may be equal to a threshold voltage range dVth2 of the second cell group G2. According to the second programming operation PGM2, a threshold voltage distribution of the second through fifth cell groups G2 through G5 is shifted to the right, and the second cell group G2 may be included in the target distribution TP1.

Next, a third programming operation PGM3 may be performed. As a third program voltage Vpgm3 is applied to the word line of memory cells of the other cells groups, that is, the third through fifth cell groups G3 through G5, a distribution of the memory cells is changed to a state as illustrated in FIG. 15D. In example embodiments, when the third program voltage Vpgm3 is applied to the word line of the third through fifth cell groups G3 through G5 an inhibit voltage is applied to bit lines connected to the first and second cell groups G1 and G2 such that memory cells of the first and second cell groups G1 and G2 are not programmed. A voltage level of the third program voltage Vpgm3 corresponds to a sum of a voltage level of the second program voltage Vpgm2 and a second offset voltage Voff2. The second offset voltage Voff2 may be equal to a threshold voltage range dVth3 of the third cell group G3. The second offset voltage Voff2 may be less than the first offset voltage Voff1. Accordingly, a shift amount of a distribution of the memory cells according to the third programming operation PGM3 may be smaller than a shift amount of a distribution of the memory cells of the second programming operation PGM2.

Next, the second verification VF2 is performed. The memory cells may be grouped into three cell groups by verifying the memory cells based on the first verification voltage Vvf1 and the second verification voltage Vvf2. The memory cells may be grouped into the first through third cell groups G1 through G3 which are included in the target distribution TP1, the fourth cell group G4, and the fifth cell group G5. According to an embodiment, by verifying memory cells of the other cell groups G3 through G5 besides the memory cells of the first cell group G1 and the second cell group G2, the memory cells of the other cell groups G3 through G5 may be divided into the third cell group G3, the fourth cell group G4, and the fifth cell group G5. In this case, consumption power according to a verify operation may be reduced.

Next, a fourth programming operation PGM4 may be performed. As a fourth program voltage Vpgm4 is applied to the word line of memory cells of the fourth cell group G4 and the fifth cell group G5, a distribution of the memory cells is changed to a state as illustrated in FIG. 15E. In example embodiments, when the fourth program voltage Vpgm4 is applied to the word line of the fourth and fifth cell groups G4 and G5 an inhibit voltage is applied to bit lines connected to the first through third cell groups G1 through G3 such that memory cells of the first through third cell groups G1 through G3 may not be programmed. A voltage level of the fourth program voltage Vpgm4 corresponds to a sum of a voltage level of the third program voltage Vpgm3 and a third offset voltage Voff3. The third offset voltage Voff3 may be equal to a threshold voltage range dVth4 of the fourth cell group G4. According to the fourth programming operation PGM4, threshold voltage distributions of the fourth cell group G4 and the fifth cell group G5 are shifted to the right, and the fourth cell group G4 may be included in the target distribution TP1.

Next, a fifth programming operation PGM5 is performed. As a fifth program voltage Vpgm5 is applied to the word line of the remaining cell group that is not included in the target distribution TP1, that is the fifth cell group G5, a distribution of memory cells is changed to a state as illustrated in FIG. 15F. In example embodiments, when the fifth program voltage Vpgm5 is applied to the word line of the fifth cell group G5 an inhibit voltage is applied to bit lines connected to the first through fourth cell groups G1 through G4 such that memory cells of the first through fourth cell groups G1 through G4 are not programmed. A voltage level of the fifth program voltage Vpgm5 corresponds to a sum of a voltage level of the fourth program voltage Vpgm4 and a fourth offset voltage Voff4. The fourth offset voltage Voff4 may be equal to a threshold voltage range dVth5 of the fifth cell group G5. The fourth offset voltage Voff4 may be greater than the other offset voltages. Thus, a shift amount of a distribution of the memory cells according to the fifth programming operation PGM5 may be greater than those of the distributions of the memory cells in the second through fourth programming operations PGM2 through PGM4 described above. Accordingly, the fifth cell group G5 may be included in the target distribution TP1. Accordingly, the memory cells may be programmed to the first program state P1.

Figure 17A:
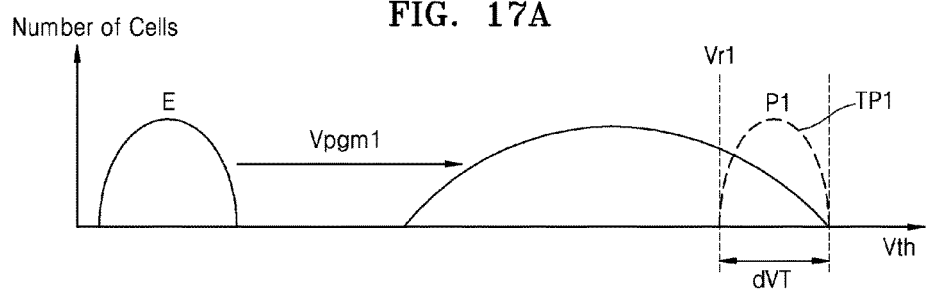
FIGS. 17A through 17D are graphs showing a programming method in a stepwise manner, according to example embodiments of the present disclosure.
Figure 17B:
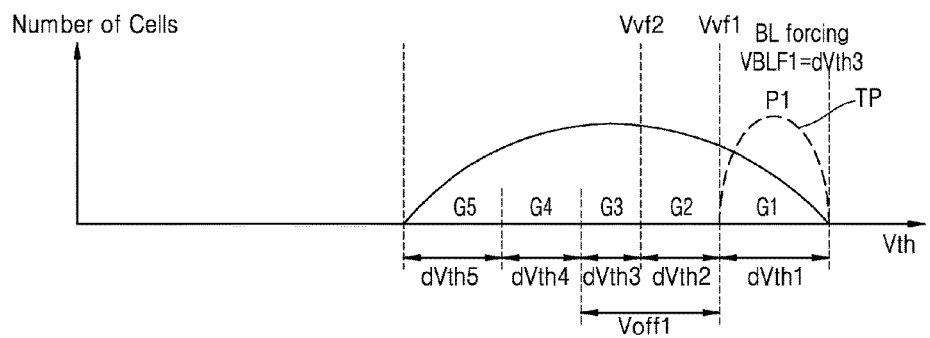
Figure 17C:
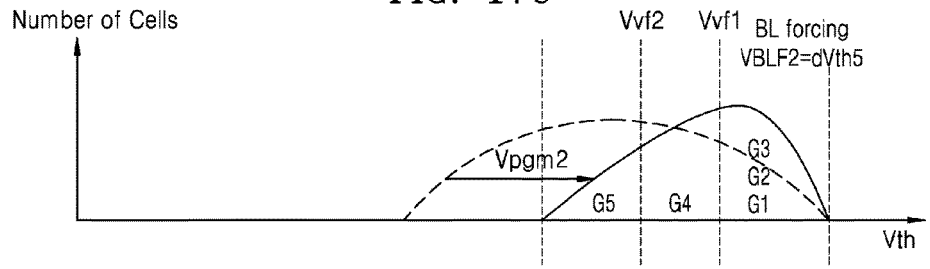

FIGS. 17A through 17D are graphs showing a programming method in a stepwise manner according to example embodiments of the present disclosure. FIG. 18 is a waveform diagram of a voltage applied to a word line connected to memory cells to be programmed according to the programming method of FIGS. 17A to 17D.

The programming method according to FIGS. 17A through 17D is similar to the method of FIGS. 15A through 15F. According to the programming method of the present embodiment, additional two cell groups may be included in the target distribution TP1 in each of the second and the third programming operations PGM2 and PGM3. Referring to the second programming operation PGM2 of FIGS. 17C and 18, a first forcing voltage VBF1 may be applied to bit lines of memory cells of the second cell group G2, and a second program voltage Vpgm2 may be applied to a word line of memory cells of the second through fifth cell groups G2 through G5. Accordingly, the memory cells of the second cell group G2 and the third cell group G3 may be included in the target distribution TP1. A voltage level of the second program Vpgm2 may correspond to a level of the first program voltage Vpgm1 increased by the first offset voltage Voff1. The first offset voltage Voff1 may be equal to a sum of a threshold voltage range dVth2 of the second cell group G2 and a threshold voltage range dVth3 of the third cell group G3, and the first forcing voltage VBLF1 may be equal to the voltage range dVth3 of the third cell group G3. In example embodiments, when the second program voltage Vpgm2 is applied to the word line of memory cells of the second through fifth cell groups G2 through G5 an inhibit voltage is applied to bit lines connected to the first cell group G1 such that memory cells of the first cell group G1 are not programmed.

Figure 17D:
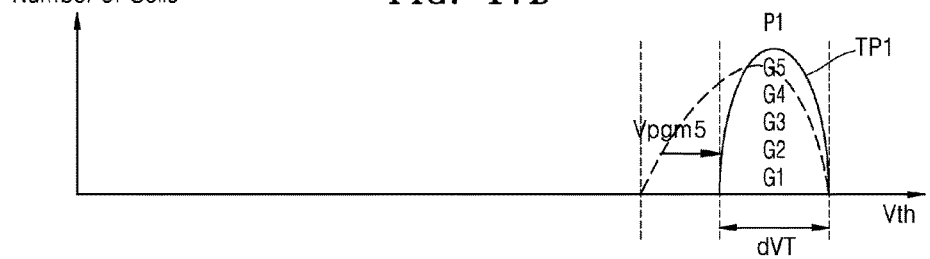
Figure 18:
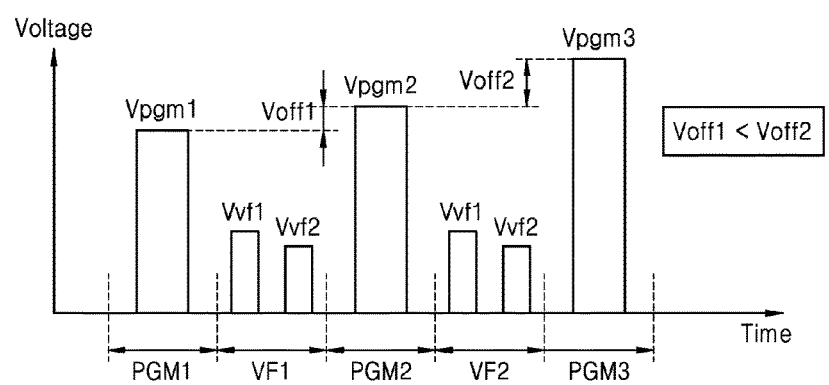
FIG. 18 is a waveform diagram of a voltage applied to a word line connected to a memory cell programmed according to the programming method of FIG. 17.

Also, when referring to the third programming operation PGM3 of FIGS. 17D and 18, in the third programming operation PGM3, a second forcing voltage VBLF2 may be applied to bit lines of memory cells of the fourth cell group G4, and a third program voltage Vpgm3 may be applied to the word line of memory cells of the fourth and fifth cell groups G4 and G5. Accordingly, the memory cells of the fourth cell group G4 and the fifth cell group G5 may be included in the target distribution TP1. A voltage level of the third program voltage Vpgm3 may correspond to a level increased from the second program voltage Vpgm2 by the second offset voltage Voff2. The second offset voltage Voff2 may be equal to a sum of the threshold voltage range dVth4 of the fourth cell group G4 and the threshold voltage range dVth5 of the fifth cell group G5, and the second forcing voltage VBLF2 may be equal to the threshold voltage range dVth5 of the fifth cell group G5. In example embodiments, when the second program voltage Vpgm2 is applied to the word line of memory cells of the fourth and fifth cell groups G4 and G5 an inhibit voltage is applied to bit lines connected to the first through third cell groups G1 through G3 such that memory cells of the first through third cell groups G1 through G3 are not programmed.

Accordingly, memory cells may be programmed to a target program state, for example, to the first program state P1, and the number of times of programming may be reduced by performing programming such that at least two cell groups are simultaneously included in a target distribution TP in each of the second and third programming operations.

Figure 19:
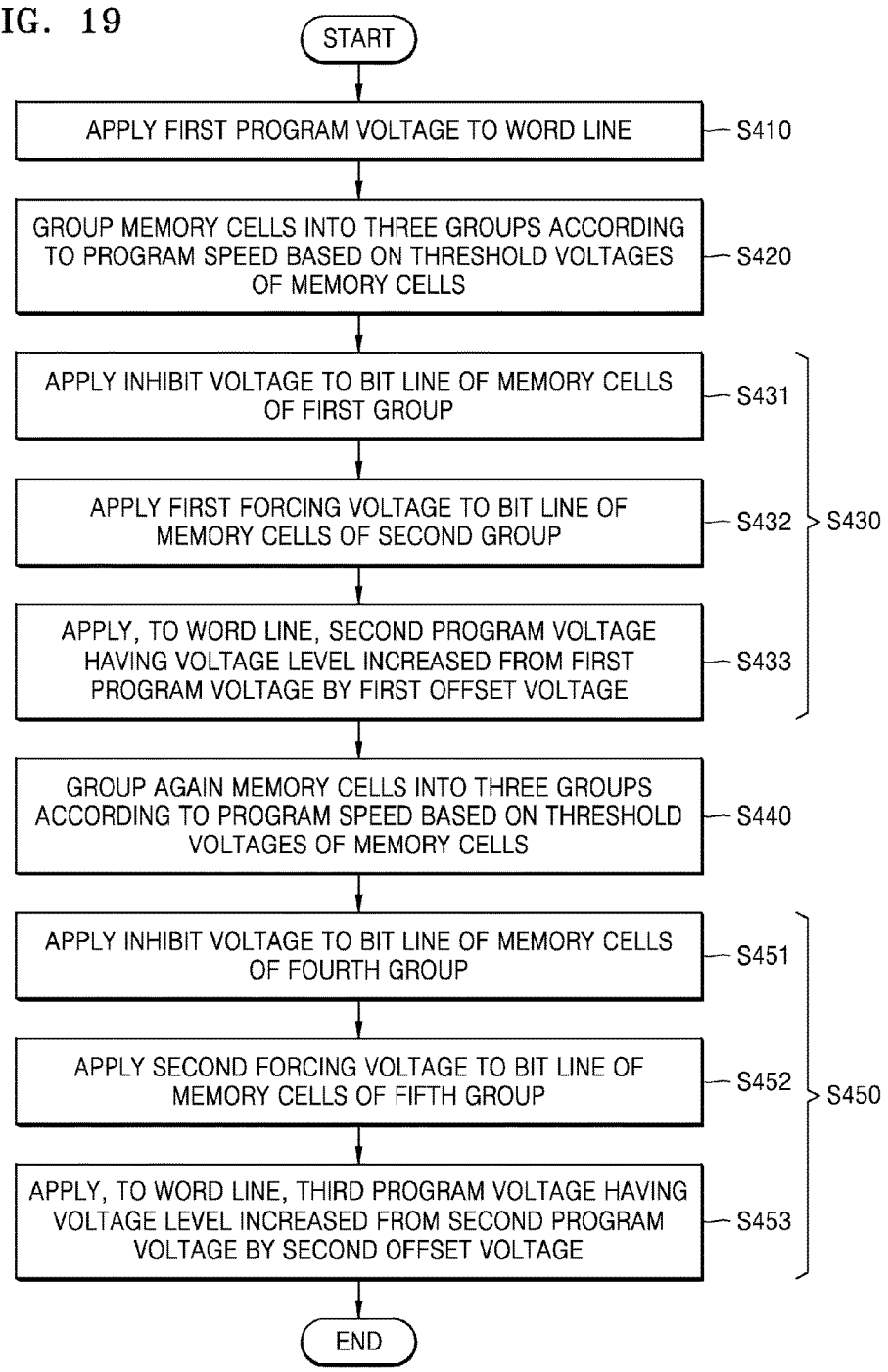
FIG. 19 is a flowchart of a method of operating a memory device according to example embodiments of the present disclosure.

FIG. 19 is a flowchart of a method of operating a memory device according to example embodiments of the present disclosure. FIG. 19 is a detailed flowchart of the method of operating a memory device of FIGS. 17A to 17D.

Referring to FIG. 19, a first programming operation is performed by applying a primary program voltage, that is, a first program voltage, to a word line to which memory cells are connected, in an operation S410. A distribution of some of the memory cells may be included in a target distribution.

Next, the memory cells on which the first programming operation is performed may be grouped into three groups according to their program speeds, based on a threshold voltage, in an operation S420. For example, the memory cells may be grouped into a first group, a second group, and a third group. For example, the first group may include the first cell group G1 of FIG. 17B, the second group may include the second cell group G2 of FIG. 17B, and the third group may include the third through fifth cell groups G3 through G5 of the FIG. 17B. By verifying the memory cells based on a preset verification voltage, the memory cells may be grouped into three groups. For example, the memory cells may be grouped into three groups based on first and second verification voltage Vvf1 and Vvf2 of the first verification operation. A threshold voltage of the first group may be the highest, and a threshold voltage of the third group may be the lowest. Here, the higher a threshold voltage of the memory cells, the higher may be a program speed of the memory cells. Accordingly, the memory cells may be grouped into three groups according to their program speeds.

Next, a second programming operation may be performed on the second group and the third group, for example, the second through fifth cell group G2 through G5 of FIG. 17B, in an operation S430. The first group which has a highest threshold voltage may be included in a target distribution. Thus, in order to prevent programming on the first group, an inhibit voltage may be applied to bit lines of the memory cells of the first group in an operation S431.

The second programming operation may be performed by applying a first forcing voltage to bit lines of the memory cells of the second group in an operation S432 and applying a second program voltage to the word line in an operation S433. A shift amount of a distribution of the second group is to be smaller than that of a distribution of the third group. Accordingly, program speeds of memory cells of the second group may be reduced by applying the forcing voltage to the bit lines of memory cells of the second group. Accordingly, based on the second program voltage, the memory cells of the second group and some of memory cells of the third group, for example, memory cells of the third cell group G3 of FIG. 17B may be programmed to a target program state at the same time. A voltage level of the second program voltage may correspond to a voltage level increased from that of the first program voltage by a first offset voltage. The first offset voltage may be equal to a sum of a threshold voltage range of the second group and a threshold voltage range of some of memory cells of the third group having a relatively high threshold voltage, for example, a threshold voltage range of the third cell group G3 of FIG. 17B, and the first forcing voltage may be equal to the threshold voltage range of the third cell group G3.

Next, the memory cells may be grouped again into three groups based on threshold voltages in an operation S440. According to an embodiment, the memory cells may be grouped into three groups based on, for example, the first and second verification voltages Vvf1 and Vvf2 of the second verification operation described above.

According to an embodiment, by verifying the other cell groups, the other cell groups may be re-grouped into a fourth group, a fifth group, and the sixth group. For example, the fourth group may include the first through third cell groups G1 through G3 of FIG. 17C, the fifth group may include the fourth cell group G4 of FIG. 17C, and the sixth group may include the fifth cell group G5 of the FIG. 17C. The memory cells of the fourth group may be included in the target distribution.

A third programming operation may be performed on the memory cells of the fifth and sixth group, for example, the fourth and fifth cell groups G4 and G5 of the FIG. 17C in an operation S450. In order to prevent programming on the memory cells of the fourth group, for example, the first through third cell groups G1 through G3 of FIG. 17C, which are already included in the target distribution, an inhibit voltage may be applied to the bit lines of the memory cells of the fourth group in an operation S451.

The third programming operation may be performed by applying a forcing voltage to a bit line of the memory cells of the fifth group, for example, the fourth cell group G4 of FIG. 17C in an operation S452, and applying a third program voltage to the word line of the memory cells of the fifth and sixth groups in an operation S453. A shift amount of a distribution of the fifth group is to be smaller than that of a distribution of the sixth group, for example, the fifth cell group G5 of FIG. 17C. Accordingly, program speeds of memory cells of the fifth group may be reduced by applying the forcing voltage to bit lines of memory cells of the fifth group. Accordingly, based on the third program voltage, the memory cells of the fifth group and the sixth group may be programmed to the target program state at the same time. A voltage level of the third program voltage corresponds to a voltage level increased from that of the second program voltage by a second offset voltage. The second offset voltage may be equal to a sum of the threshold voltage range of the fifth group and the threshold voltage range of the sixth group, and the second forcing voltage may be equal to the threshold voltage range of the sixth group.

As described above, after the first programming operation is performed on the memory cells of the word line that are set to be programmed to the first program state, the memory cells may be grouped into five cell groups according to their program speeds, and reprogramming may be performed on each unit including two cell groups among the remaining other cell groups except the first cell group that is programmed to the first program state.

Figure 20:
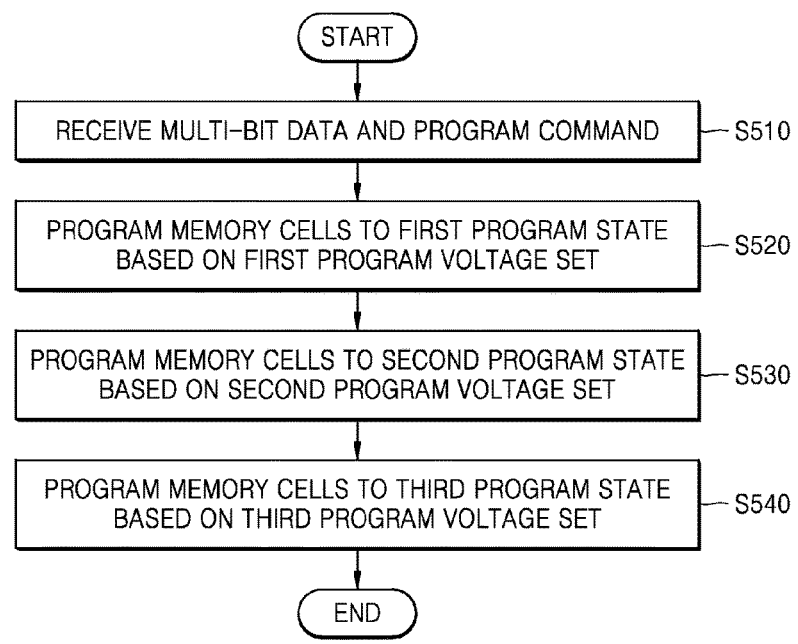
FIG. 20 is a flowchart of a method of operating a memory device, according to example embodiments of the present disclosure.
Figure 21:
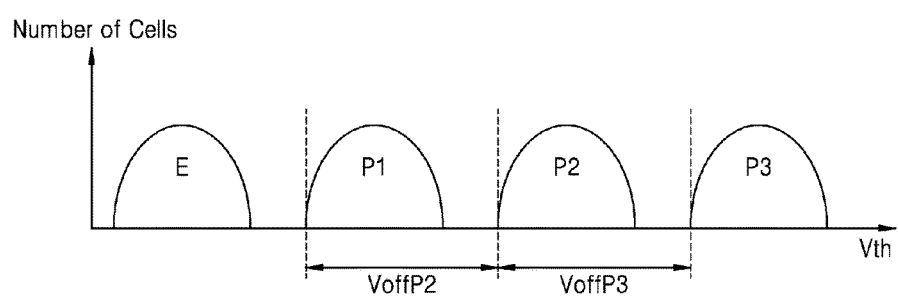
FIG. 21 illustrates threshold voltage distributions of memory cells according to respective program states.

FIG. 20 is a flowchart of a method of operating a memory device according to example embodiments of the present disclosure. FIG. 20 illustrates a programming method performed when a memory device stores 2-bit data in each memory cell. FIG. 21 illustrates threshold voltage distributions of memory cells according to respective program states.

Referring to FIG. 20, when the memory device 100 (see FIG. 1) receives multi-bit data and a program command from the outside, for example, a memory controller, in an operation S510, the memory device 100 may perform a programming operation according to an embodiment of the present disclosure.

The memory device may program the memory cells to a first program state based on a first program voltage set in an operation S520. The first program voltage set may include first through nth program voltages used to program memory cells to the first program state. The first program voltage may be a primary program voltage, and the second through nth program voltages may be a plurality of secondary program voltages. When programming memory cells by grouping the memory cells into three cell groups according to their program speeds as illustrated in FIG. 5A, the first program voltage set may include first through third program voltages. According to another embodiment, the first program voltage set may include first and second program voltages and a forcing voltage.

The first program voltage may be preset such that at least some of the memory cells are included in a target distribution in a target program state. According to an embodiment, the first program voltage may be preset such that, when memory cells are grouped into a plurality of cell groups after a primary programming operation is performed, memory cells of an uppermost cell group of a one-shot distribution are included in the target distribution. The second through nth program voltages may be voltages that are set based on differences between threshold voltages of a plurality of cell groups (e.g., threshold voltage ranges of the plurality of cell groups).

When a programming operation to the first program state is completed, the memory device may program memory cells to a second program state based on a second program voltage set in an operation S530. The second program voltage set may include first through nth program voltages used to program the memory cells to the second program state.

According to an embodiment, the memory device may program some of the memory cells programmed to the first program state, to the second program state. According to another embodiment, the memory device may program memory cells other than the memory cells programmed to the first program state, to the second program state.

When a programming operation to the second program state is completed, the memory device may program memory cells to a third program state based on a third program voltage set in an operation S540. The third program voltage set may include first through nth program voltages used to program memory cells to the third program state.

According to an embodiment, the memory device may program some of the memory cells that are programmed to the second program state, to the third program state. According to another embodiment, the memory device may program memory cells other than the memory cells programmed to the first or second program state, to the third program state.

A voltage level of the first program voltage with respect to each program state, that is, a voltage level of the primary program voltage may be set based on the first program voltage of a previous program state and a program offset.

Figure 22:
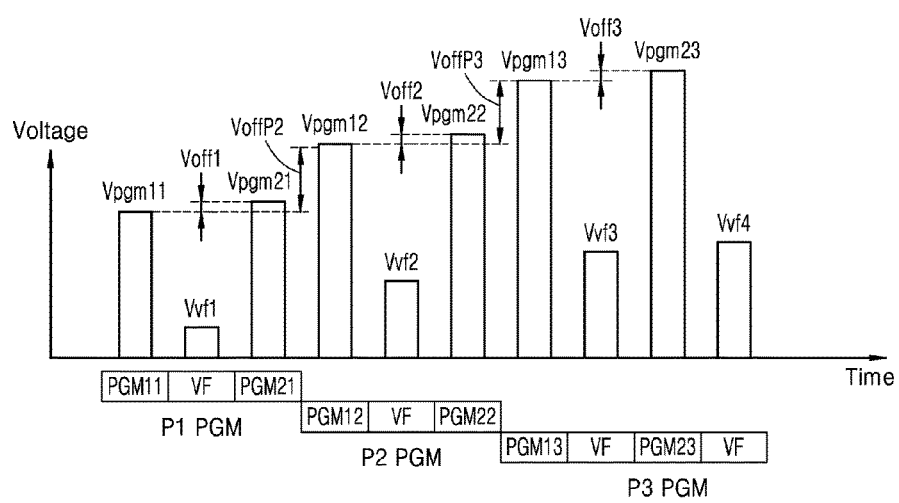
FIG. 22 illustrates an example of a method of operating a memory device, according to example embodiments of the present disclosure, wherein a waveform diagram of a voltage pulse applied to a word line is illustrated.

As illustrated in FIGS. 21 and 22, when a threshold voltage difference between a second program state P2 and a first program state P1 is a second program offset VoffP2, a voltage level of a first program voltage Vpgm12 with respect to the second program state P2 may be set based on a first program voltage Vpgm11 with respect to the first program state P1 and the second program offset VoffP2. Also, when a threshold voltage difference between a third program state P3 and the second program state P2 is a third program offset VoffP3, a voltage level of a first program voltage Vpgm13 with respect to the third program state P3 may be set based on the first program voltage Vpgm12 with respect to the second program state P2 and the third program offset VoffP3.

Meanwhile, the programming method according to the embodiment of the present disclosure described above with reference to FIGS. 5A through 19 may be applied to each of the programming operations S520, S530, and S540. In each programming operation, a programming operation may be performed by grouping memory cells, on which a first programming operation is performed based on a first program voltage, that is, a primary program voltage, into a plurality of cell groups according to their program speeds, and applying a plurality of secondary program voltages that are set according to different threshold voltage ranges of the plurality of cell groups to a memory cell group that is not included in a target distribution.

When programming memory cells to a plurality of program states by using an ISPP method, if a threshold voltage difference between two program states is relatively large, the number of times of programming may be greater than when a threshold voltage difference between two program states is relatively small. However, according to the method of operating a memory device of the example embodiments of the present disclosure, program voltages corresponding to respective program states are preset, and memory cells are respectively programmed to the program states based on the preset program voltages. Thus, the memory cells may be programmed based on the preset number of times of programming regardless of a threshold voltage difference between two program states.

FIG. 22 illustrates an example of a method of operating a memory device according to example embodiments of the present disclosure, wherein a waveform diagram of a voltage pulse applied to a word line is illustrated.

FIG. 22 illustrates a method in which memory cells, which are each a MLC storing 2-bit data, are programmed sequentially to a first program state P1, a second program state P2, and a third program state P3.

Referring to FIG. 22, a programming operation of a memory device may include a first programming period P1 PGM, a second programming period P2 PGM, and a third programming period P3 PGM.

When a command requesting multi-bit data and requesting to store the multi-bit data is received from the outside (for example, a memory controller), memory cells may be programmed to a first program state in the first program period P1 PGM, the memory cells may be programmed to a second program state in the second program period P2 PGM, and the memory cells may be programmed to a third program state in the third program period P3 PGM. Accordingly, the multi-bit data may be stored in memory cells connected to one word line of the memory cell array 110 (see FIG. 1), for example, in a page.

Each program period, that is, each program loop may include at least two programming operations, for example, first and second programming operations, and a verify operation VF. FIG. 22 illustrates that each program period includes two programming operations and one verify operation, but the embodiments of the present disclosure are not limited thereto. The number of times of programming and the number of times of a verifying operation may be increased based on how many cell groups memory cells are grouped into, according to their program speeds, whether a bit line forcing program is performed with respect to some cell groups, or the like.

Meanwhile, programming operations and a read and verify operation, which are performed in each program period, may be performed in according to the method described with reference to FIGS. 5A through 19. Memory cells on which a first programming operation is performed may be grouped into a plurality of cell groups according to their program speeds, based on a primary program voltage in a verify operation VF, and a reprogramming operation (for example, second programming and third programming) may be performed on cell groups which are not included in a target distribution, based on a plurality of secondary program voltages, for example, second and third program voltages, whose voltage levels are set based on threshold voltage ranges of the plurality of cells groups so that the memory cells are included in a target distribution of each program state.

Meanwhile, in each program period, voltage levels of primary program voltages Vpgm11, Vpgm12, and Vpgm13 may be determined based on a primary program voltage of a previous program period and a program offset of each program state. The program offset refers to a threshold voltage difference between program states as illustrated in FIG. 21. For example, in the second program period P2 PGM, a voltage level of the primary voltage Vpgm12 may be a sum of the primary program voltage Vpgm11 in the first program period P1 PGM and the second program offset VoffP2. In the third program period P3 PGM, a voltage level of the primary voltage Vpgm13 may be a sum of the primary program voltage Vpgm12 in the second program period P2 PGM and the third program offset VoffP3.

After memory cells are programmed to the third program state, a verify operation may be performed. Whether the memory cells are properly programmed or not may be determined through the verify operation. According to an embodiment, a verify operation may be performed with respect to the third program state. When it is determined that the memory cells are properly programmed to the third program state, then it may be determined that other memory cells are programmed properly to the first program state or the second program state. However, the embodiments of the present disclosure are not limited thereto, and according to another embodiment, a verify operation may also be performed with respect to each of the first through third program states.

Figure 23:
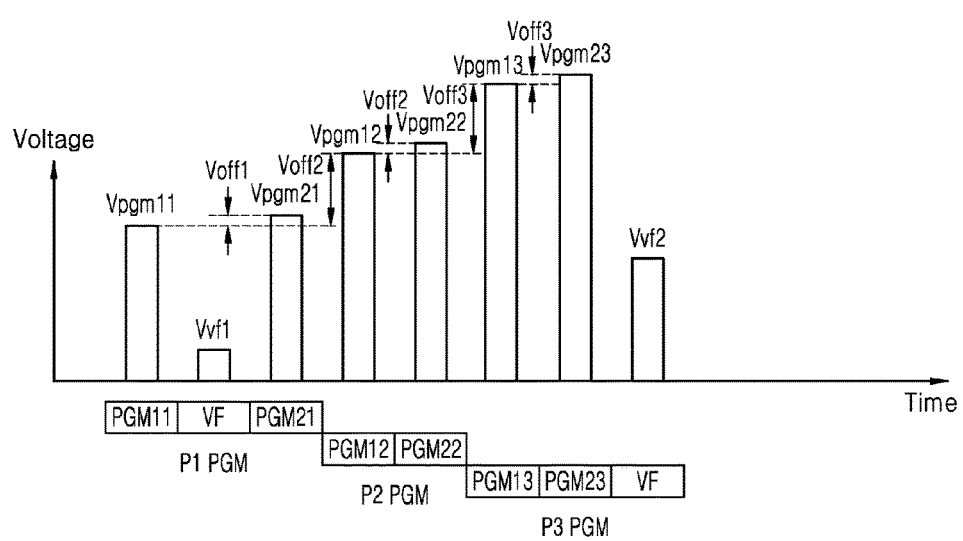
FIG. 23 illustrates an example of a method of operating a memory device, according to example embodiments of the present disclosure, wherein a waveform diagram of a voltage pulse applied to a word line is illustrated.

FIG. 23 illustrates an example of a method of operating a memory device according to example embodiments of the present disclosure, wherein a waveform diagram of a voltage pulse applied to a word line is illustrated.

FIG. 23 illustrates a method in which memory cells, which are each a MLC storing 2-bit data, are sequentially programmed to a first program state P1, a second program state P2, and a third program state P3. The programming method of FIG. 23 is similar to that illustrated in FIG. 22. According to the programming method of FIG. 23, memory cells are grouped into a plurality of cell groups according to their program speeds in a verify operation VF of a first program period P1 PGM, in which the memory cells are programmed to the first program state P1, and the cell groups respectively corresponding to the memory cells may be stored in a register. For example, when the plurality of cell groups include first through third cell groups, and the first cell group is designated as fast cells, the second cell group is designated as normal cells, and the third cell group is designated as slow cells, information indicating whether memory cells are fast cells, normal cells, or slow cells may be stored. For example, the information may be stored in a register included inside a program controller (for example, the program controller 160 of FIG. 1).

Accordingly, in the second program period P2 PGM and the third program period P3 PGM, after the primary program voltage Vpgm12 is applied, reprogramming may be performed, without a verify operation, by applying second program voltages Vpgm22 and Vpgm23 to other memory cells besides the memory cells that are classified as the first cell group, for example, as fast cells, in the first program period P1 PGM.

Figure 24:
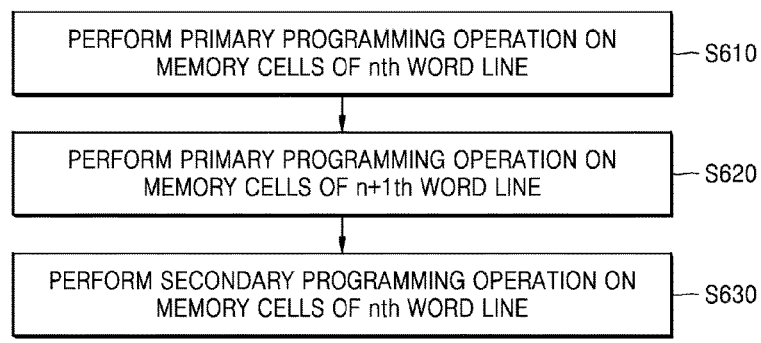
FIG. 24 is a flowchart of a programming method according to example embodiments of the present disclosure.
Figure 25A:
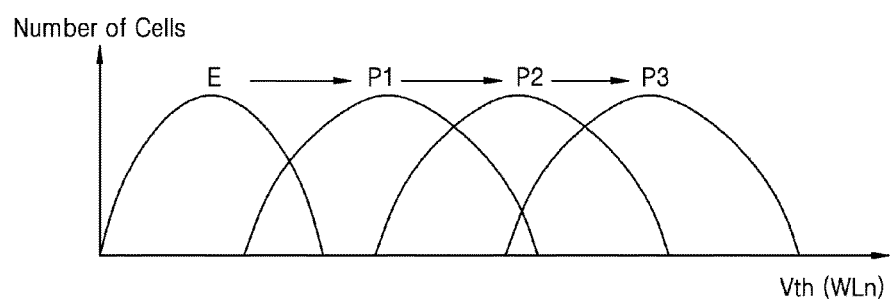
FIGS. 25A through 25C are graphs showing threshold voltage distributions of a word line according to respective operations of the flowchart of FIG. 24.
Figure 25B:
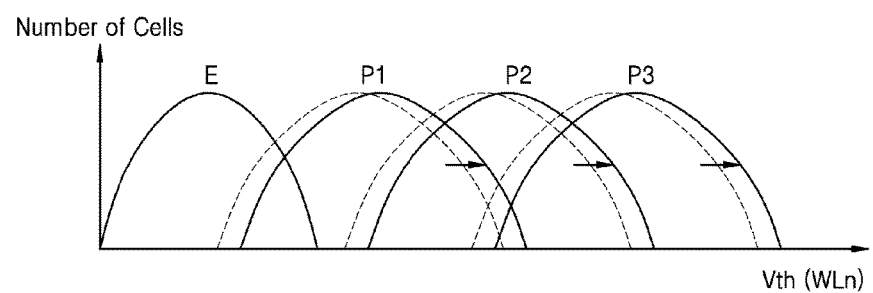
Figure 25C:
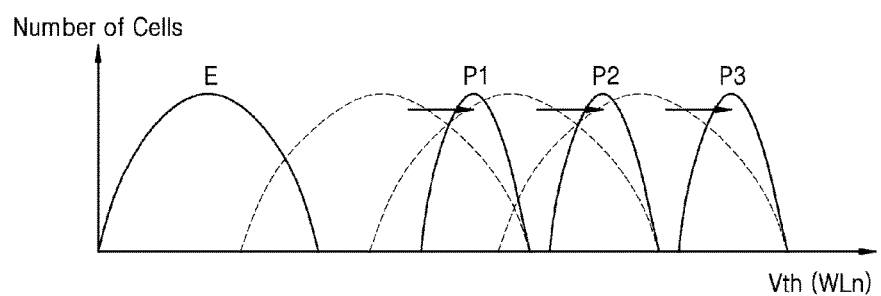

FIG. 24 is a flowchart of another example of a programming method according to example embodiments of the present disclosure. FIGS. 25A through 25C are graphs showing threshold voltage distributions of a word line according to respective operations of the flowchart of FIG. 24. The programming method of FIG. 24 is a method used to reduce coupling effects between adjacent word lines in a programming operation according to an embodiment of the present disclosure. The programming method of FIG. 24 is a modified example of the programming method of FIGS. 5A through 19. Accordingly, description provided above with reference to FIGS. 5A through 19 may be applied to the present embodiment of FIG. 24.

Referring to FIG. 24, a primary programming operation (1st PGM) is performed on memory cells of an nth word line WLn (where n is an integer) in an operation S610. The primary programming operation (1st PGM) may include applying a primary program voltage to the memory cells of the nth word line WLn. Accordingly, a one-shot distribution of the memory cells according to the primary program voltage may be formed. The primary program voltage may include a plurality of first program voltages respectively corresponding to a plurality of program states corresponding to multi-bit data stored in the memory cells. According to an embodiment, the plurality of first program voltages may be set such that memory cells less than m memory cells (where m is an integer equal to or greater than 2) having a relatively high program speed among the memory cells of the nth word line are programmed to corresponding program states. The primary programming operation (1st PGM) may include an operation of sequentially applying the plurality of first program voltages to the nth word line WLn. Accordingly, as illustrated in FIG. 25A, one-shot distributions of the memory cells with respect to respective program states, for example, the first through third program states P1, P2, and P3, may be formed.

Next, in an operation S620, a primary programming operation (1st PGM) is performed on memory cells of an n+1th word line WLn+1. The n+1th word line WLn+1 is disposed adjacent to the nth word line WLn, and the primary programming operation may be performed on the n+1th word line WLn+1 after the primary performing operation is performed on the nth word line WLn. A plurality of first program voltages corresponding to the n+1th word line WLn+1 may be applied to the n+1th word line WLn+1 during the primary programming operation (1st PGM) of the n+1th word line WLn+1, and one-shot distributions of the memory cells of the n+1th word line WLn+1 according to respective program states may be formed as illustrated in FIG. 25A. When the memory cells of the n+1th word line WLn+1 are programmed, coupling effects may be generated on the memory cells of the nth word line WLn. Accordingly, as illustrated in FIG. 25B, the one-shot distributions corresponding to the program states of the memory cells of the nth word line WLn may be shifted to the right.

Next, a secondary programming operation (2nd PGM) is performed on the memory cells of the nth word line WLn in an operation S630. The secondary programming operation (2nd PGM) may include a verify operation VF in which the memory cells of the nth word line WLn are grouped into a plurality of cell groups having different threshold voltage distribution widths from one another, or at least one cell groups having a different threshold voltage distribution width from others, based on their program speeds, and a reprogramming operation PGM2 in which other cell groups besides some of the plurality of cells group, for example, besides a first cell group programmed to a target state, are reprogrammed based on a plurality of secondary program voltages based on threshold voltage differences between the plurality of cell groups. According to an embodiment, the first cell group having a highest threshold voltage distribution among the plurality of cell groups may include m or more memory cells.

According to an embodiment, the secondary programming operation (2nd PGM) may further include an additional verify operation of determining whether the memory cells of the nth word line WLn are properly programmed to corresponding program states.

According to the present embodiment, when performing a programming operation on the nth word line WLn, a primary programming operation (1st PGM) is performed on the memory cells of the n+1 word line WLn+1 before performing a secondary programming operation (2nd PGM) so as to perform the secondary programming operation (2nd PGM) on the memory cells of the nth word line WLn based on the one-shot distributions of the memory cells of the nth word line WLn, to which coupling effects are reflected in advance. Accordingly, a shift in the threshold voltage distributions of the program states due to coupling effects between word lines may be prevented.

Figure 26A:
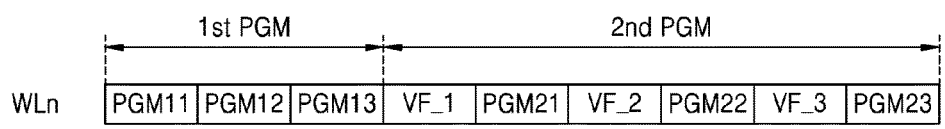
FIGS. 26A and 26B respectively illustrate a primary program operation and a secondary program operation performed on memory cells of a word line.
Figure 26B:
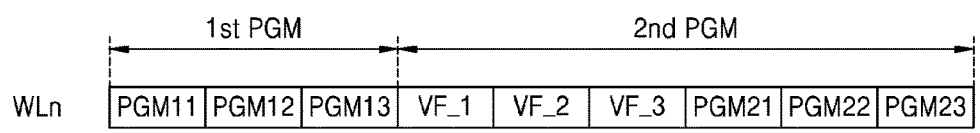

FIGS. 26A and 26B respectively illustrate a primary programming operation and a secondary programming operation on memory cells of a word line. Description will focus on an embodiment in which 2-bit data is stored in each memory cell, and memory cells are programmed to first through third program states.

Referring to FIGS. 26A and 26B, first program voltages respectively corresponding to first through third program states are applied to a word line (for example, an nth word line WLn), thereby performing the primary programming operation including PGM11, PGM12, and PGM13 (1st PGM) corresponding to the first through third program states, respectively.

Next, the secondary programming operation (2nd PGM) may be performed on the memory cells of the word line (e.g., the nth word line WLn). Here, as illustrated in FIG. 26A, a verify operation and a reprogramming operation with respect to each program state may be sequentially performed. For example, as a verify operation VF_1 and a reprogramming operation (for example, a second programming operation PGM21) with respect to a first program state are performed, the programming operation of memory cells to the first program state may be completed, and next, as a verify operation VF_2 and a reprogramming operation (for example, a second programming operation PGM22) with respect to a second program state are performed, the programming operation of the memory cells to the second program state may be completed, and finally, as a verify operation VF_3 and a reprogramming operation (for example, a second programming operation PGM23) with respect to a third program state are performed, the programming operation of the memory cells to the third program state may be completed.

According to another embodiment, as illustrated in FIG. 26B, in the secondary programming operation (2nd PGM), after verify operations VF_1, VF_2, and VF_3 with respect to all program states are performed, a reprogramming operation with respect to each program state (for example, secondary programming operations PGM21, PGM22, and PGM23 on each program state) may be performed.

Figure 27:
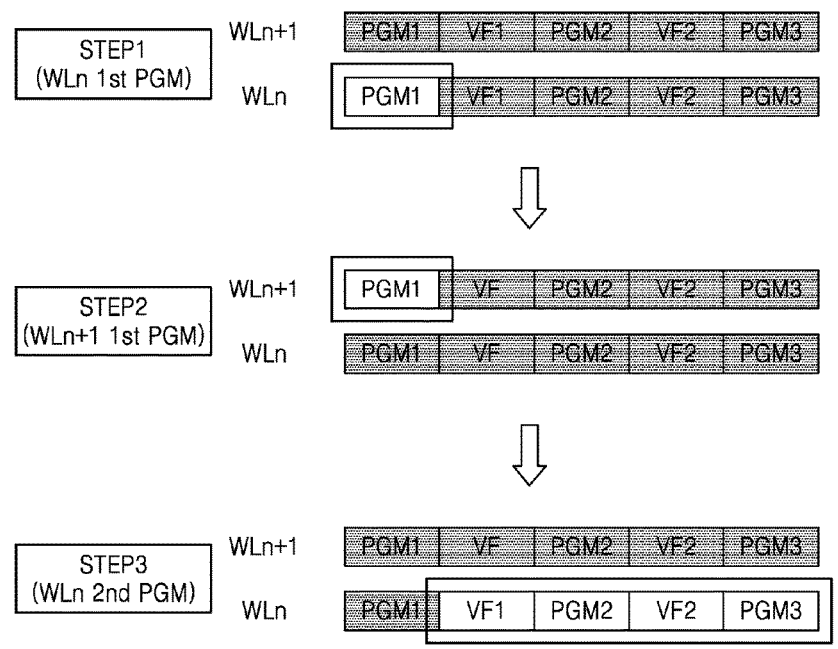
FIG. 27 is a flowchart of another example of a programming method according to example embodiments of the present disclosure.

FIG. 27 is a flowchart of another example of a program method according to example embodiments of the present disclosure. The programming method of FIG. 27 is similar to the programming method of FIGS. 25A through 25C. In example embodiments, in an operation of grouping memory cells into a plurality of cell groups according to their program speeds as illustrated in FIG. 14A, when memory cells are grouped into at least five cell groups, a secondary programming operation may include a plurality of times of verify operations and a plurality of times of reprogramming operations as illustrated in FIG. 27.

Figure 28:
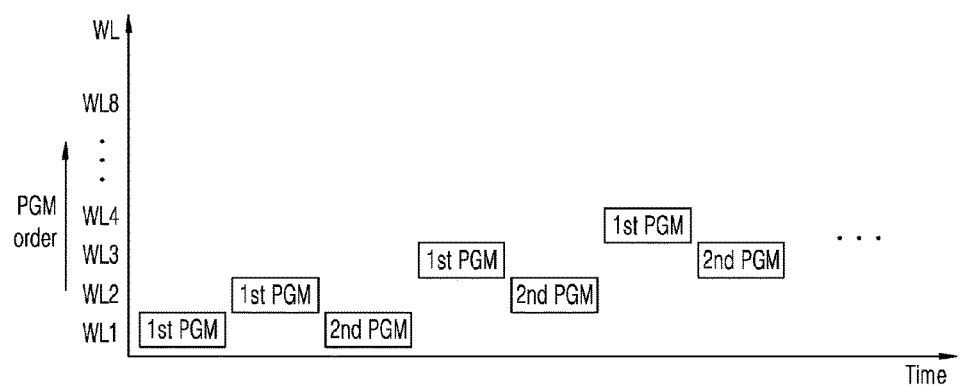
FIG. 28 illustrates a programming method of a memory cell array according to example embodiments of the present disclosure.

FIG. 28 illustrates a programming method of a memory cell array according to example embodiments of the present disclosure. According to an embodiment, the memory cell array may include a two-dimensional memory cell array.

Referring to FIG. 28, the memory cell array may include a plurality of memory blocks each block including a plurality of word lines, for example, first through eighth word lines WL1 through WL8. According to an embodiment, the first through eighth word lines WL1 through WL8 may be disposed sequentially adjacent to one another, and a programming operation may be sequentially performed from the first word line WL1 to the eighth word line WL8.

Here, in order to reduce coupling effects generated as a programming operation is performed on adjacent word lines, as described above with reference to FIG. 24, when performing programming operation on a particular word line, primary programming operation (1st PGM) may be performed on an adjacent word line that is programmed after the particular word line is programmed, and then a secondary programming operation (2nd PGM) may be performed on the particular word line.

For example, a primary programming operation (1st PGM) may be performed on memory cells of a first word line WL1, and a primary programming operation (1st PGM) may be performed on memory cells of a second word line WL2. Next, a secondary programming operation (2nd PGM) may be performed on the memory cells of the first word line WL1, thereby completing the programming operation of the memory cells of the first word line WL1.

Next, a primary programming operation (1st PGM) may be performed on a third word line WL3, and a secondary programming operation (2nd PGM) may be performed on the second word line WL2, thereby completing the programming operation of the memory cells of the second word line WL2.

According to example embodiments, a programming operation may be sequentially performed on all word lines, for example, the first through eighth word lines WL1 through WL8 of each block.

Figure 29:
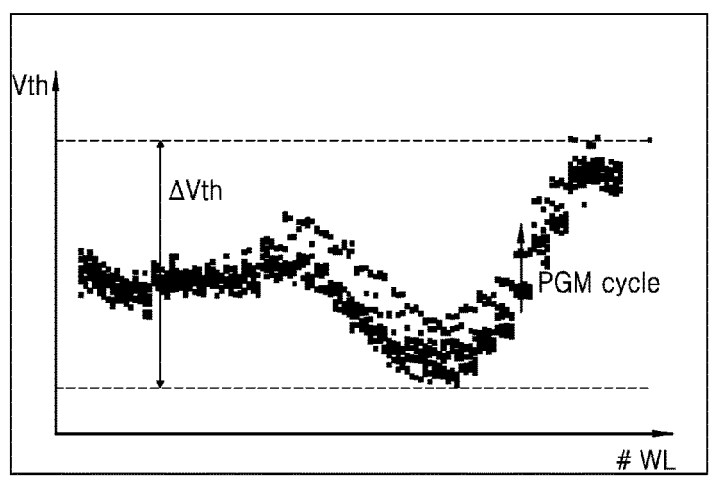
FIG. 29 is a graph showing program speeds of respective word lines.

FIG. 29 is a graph showing program speeds of respective word lines.

A horizontal axis indicates a word line number, and a vertical axis denotes a threshold voltage of each word line when a one-shot voltage pulse is applied to each word line to program memory cells to a predetermined state, for example, to a pre-program state. It may be regarded that the higher a threshold voltage, the higher may be a program speed.

As illustrated in FIG. 29, a program speed may vary according to word lines. Also, a single word line may have different program speeds depending on a program cycle. As illustrates in FIG. 29, as the number of times of a program cycle increases, that is, as the number of times of programming and erasing increases, a program speed of a word line (e.g., a program speed of corresponding memory cells) may be increased.

If a difference between program speeds of word lines is great, distribution widths of program states of programmed memory cells may be increased. Accordingly, the program speeds have to be compensated.

Figure 30:
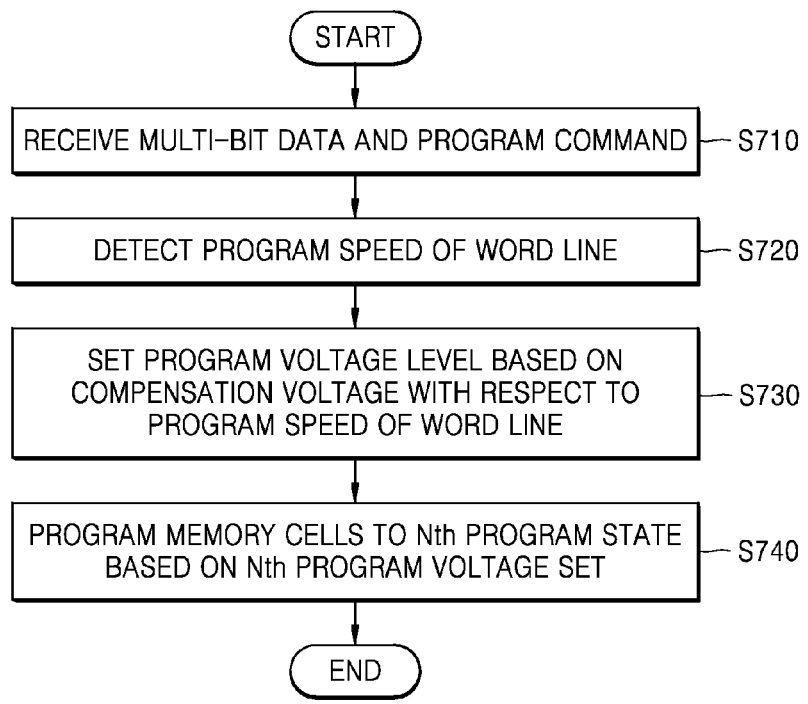
FIG. 30 is a flowchart of a method of operating a memory device according to an embodiment of the present disclosure.

FIG. 30 is a flowchart of a method of operating a memory device according to an embodiment of the present disclosure.

Referring to FIG. 30, the memory device 100 (see FIG. 1) may receive multi-bit data and a program command from the outside, for example, from a memory controller, in an operation S710. The memory device may detect a program speed of a word line corresponding to an address to which a programming operation is to be performed, in an operation S720.

According to an embodiment, the memory device may apply a pre-program voltage to a word line, on which a programming operation is to be performed, and may detect a program speed of the word line by counting the number of off-cells which are programmed to the pre-program state.

The memory device may set voltage levels of program voltages by compensating for the program speeds of the word lines by reflecting the detected program speeds of each of the word lines in an operation S730. For example, if a program speed of a word line is different from a reference value, a compensation voltage set based on the difference between the detected program speed and the reference value may be added to a predetermined level of the program voltages.

Meanwhile, as illustrated in FIG. 22, voltage levels of the secondary program voltages Vpgm21, Vpgm22, and Vpgm23 may be set based on primary program voltages Vpgm11, Vpgm12, and Vpgm13 of respective program states. According to an embodiment, when setting a voltage level of the primary program voltages Vpgm11, Vpgm12, and Vpgm13 of respective program states, a compensation voltage according to the program speed may be reflected, thereby setting voltage levels of a program voltage set with respect to each program state, in which the program speed of each of the word lines is compensated.

In addition, as illustrated in FIG. 22, the primary program voltages Vpgm12 and Vpgm13 of respective program states except the first program state may be set based on the primary program voltage of the previous program state. For example, the primary program voltages Vpgm12 with respect to the second program state P2 may be set based on the primary program voltage Vpgm11 with respect to the first program state. Accordingly, when setting a voltage level of the primary program voltage Vpgm11 with respect to the first program state, a compensation voltage according to the program speed may be reflected, thereby setting voltage levels of program voltages, in which the program speed of word lines is compensated. Accordingly, a program voltage set with respect to each program state may be set. The program voltage set may include a primary program voltage and a plurality of secondary program voltages.

Next, a programming operation to each program state may be performed based on the voltage levels of the program voltages, in which the program speed is reflected. Memory cells may be programmed to an Nth program state based on the Nth program voltage set in an operation S740. For example, when memory cells are programmed to first through third program states, the memory cells may be programmed to the first through third program states based on first through third program voltage sets.

Figure 31:
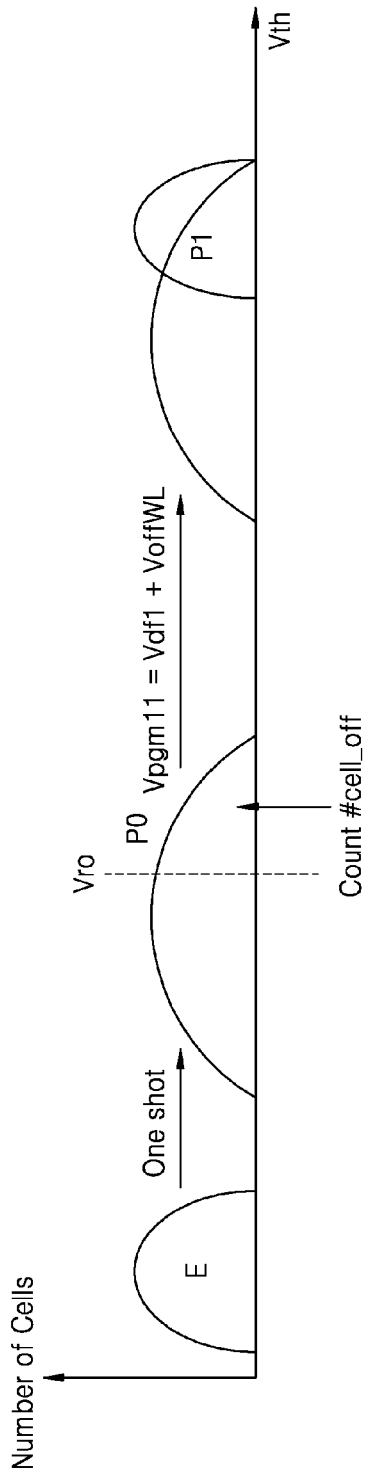
FIG. 31 is a diagram illustrating a method of detecting a program speed of a word line and compensating a program voltage level, according to example embodiments of the present disclosure.

FIG. 31 is a view illustrating a method of detecting a program speed of a word line and compensating a program voltage level according to example embodiments of the present disclosure.

Referring to FIG. 31, in order to detect a program speed of the word line, the memory device may apply a one-shot pre-program voltage to the word line to program memory cells of the word line to a pre-program state P0. The memory device may detect the program speed of the word line by counting the number of memory cells which are programmed to the pre-program state P0, that is, the number of off-cells with respect to the preprogram state P0.

The pre-program state P0 may be between an erased state E and a first program state P1. The pre-program state P0 may not correspond to multi-bit data stored in memory cells, and may be an arbitrary state used to detect a program speed of a word line.

The number of off-cells of the pre-program state may correspond to a program speed of a word line. The more the number of off-cells, the higher may be the program speed. The memory device may determine a program speed based on the number of off-cells, and apply a compensation voltage corresponding to the program speed when setting voltage levels of program voltages. For example, the number of off-cells of the pre-program state P0 may be determined by using a particular verifying voltage Vr0.

According to an embodiment, a memory device, for example, a program controller (the program controller 160 of FIG. 1) may include a table storing compensation voltages according to the number of off-cells. The memory device may select a compensation voltage according to the counted number of off-cells by referring to the table, and apply the compensation voltage when setting a program voltage level.

For example, as illustrated in FIG. 31, a compensation voltage may be applied when setting a start voltage of programming. For example, a program start voltage may be a primary program voltage Vpgm11 in a first program state. A voltage level of the primary program voltage Vpgm11 in the first program state may be set as a compensation voltage VoffWL according to a program speed of a word line is added to a program start voltage Vdf1 of a predetermined level.

Figure 32:
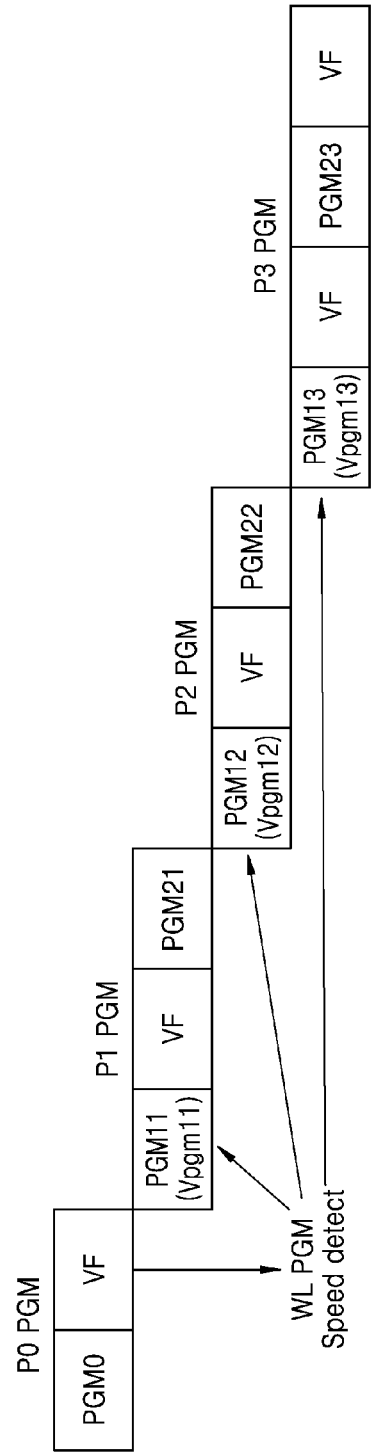
FIG. 32 illustrates a method of setting a program voltage by reflecting a program speed of a word line, according to example embodiments of the present disclosure.

FIG. 32 illustrates a method of setting a program voltage level by reflecting a program speed of a word line according to example embodiments of the present disclosure.

Referring to FIG. 32, in a pre-program operation P0 PGM, a program speed of a word line may be detected by applying a pre-program voltage to memory cells and counting the number of off-cells in the pre-program state through a verifying operation. Next, the compensation voltage may be applied when setting a program voltage set corresponding to each program operation in each of programming operations P1 PGM, P2 PGM, and P3 PGM. For example, the compensation voltage may be applied when setting first program voltages Vpgm11, Vpgm12, and Vpgm13 of the programming operations P1 PGM, P2 PGM, and P3 PGM, respectively.

FIGS. 33A through 33C are graphs showing threshold voltage distributions of word lines according to operations of a programming method according to example embodiments of the present disclosure.

The programming method illustrated in FIGS. 33A through 33C is a modified example of the programming method of FIGS. 25A through 25C. Referring to FIGS. 33A and 33B, a primary programming operation (1st PGM) may be performed on memory cells of an nth word line WLn, and then a primary programming operation (1st PGM) may be performed on memory cells of an n+1th word line WLn+1 which is disposed adjacent to the nth word line WLn. Each primary programming operation may include a pre-programming operation PGM0, a pre-verifying operation VF0, and a programming operation PGM1 of applying a primary program voltage corresponding to each program operation to memory cells. In the pre-programming operation PGM0, a pre-program voltage is applied to a word line of memory cells, and in the pre-verify operation VF0, the number of off-cells with respect to the pre-program state is counted to detect a program speed of a word line. A voltage level of a program voltage set with respect to each program state may be set based on a compensation voltage according to the detected program speed of the word line. For example, a compensation voltage may be added to a voltage level of a primary program voltage corresponding to each program state. Next, a one-shot distribution corresponding to each of program states may be formed by applying, to memory cells, to which the pre-program voltage is applied, a primary program voltage according to each program state, to which the compensation voltage according to the program speed of the word line is added.

Next, as illustrated in FIG. 33C, a programming operation on the memory cells of the nth word line WLn may be completed by performing a secondary programming operation (2nd PGM) on the nth word line WLn. The secondary programming operation (2nd PGM) may include an operation VF, in which the memory cells of the nth word line WLn are grouped into a plurality of cell groups having different threshold voltage distribution widths from one another, based on their program speeds, and a reprogramming operation PGM2 in which other cell groups besides some of the plurality of cells group, for example, besides a first cell group programmed to a target state, are reprogrammed based on a plurality of secondary program voltages based on threshold voltage differences between the plurality of cell groups. Here, the plurality of secondary program voltages may be set based on threshold voltage differences between the plurality of groups and a compensation voltage according to the program speed of the word line.

Figure 34:
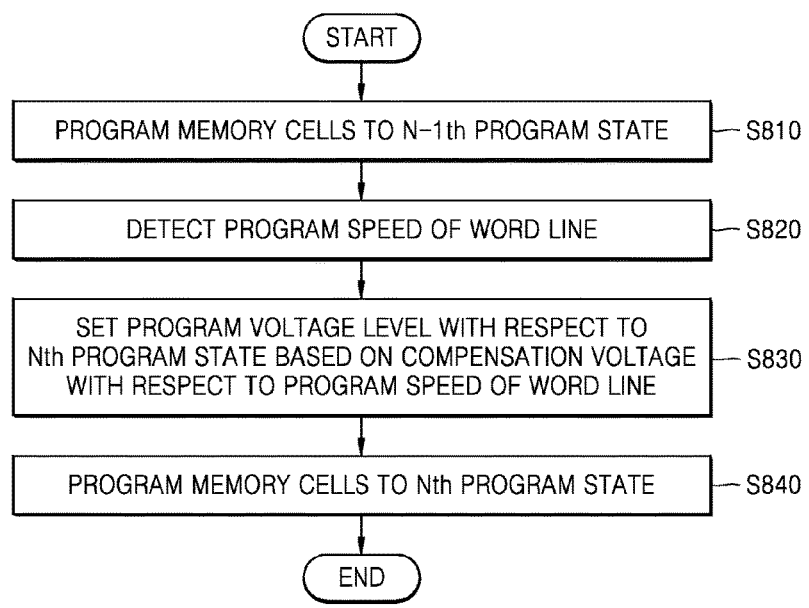
FIG. 34 is a flowchart of a method of operating a memory device, according to example embodiments of the present disclosure.

FIG. 34 is a flowchart of a method of operating a memory device according to example embodiments of the present disclosure.

Referring to FIG. 34, memory cells may be programmed to an N−1th program state (N is an integer equal to or greater than 2) in an operation S810. The N−1th program state may be a program state from among a plurality of program states except an uppermost program state having a highest threshold voltage.

After the memory cells are programmed to the N−1th program state or while the memory cells are being programmed to the N−1th program state, a program speed of a word line may be detected in operation S820. According to an embodiment, a program speed may be detected by counting the number of off-cells during an operation of verifying with respect to the N−1th program state. For example, when grouping the memory cells into a plurality of cell groups after performing a primary programming operation on the memory cells, the number of memory cells of a first cell group having a highest threshold voltage level may be counted to detect a program speed of a word line.

A voltage level of a program voltage with respect to an Nth program state, for example, a voltage level of an Nth program voltage set, may be set based on a compensation voltage according to the detected program speed of the word line in operation S830. That is, the compensation voltage according to the program speed of the word line corresponding to the N−1th program state may be reflected in the Nth program voltage set.

Accordingly, the memory cells may be programmed to the Nth program state based on the Nth program voltage set, to which the compensation voltage according to the program speed of the word line corresponding to the N−1th program state is reflected, in operation S840.

According to an embodiment, the flowchart of FIG. 34 illustrates an operating method performed after operation S730 of FIG. 30.

According to operations S720 and S730 of FIG. 30 described above, a program speed of a word line is detected before performing a programming operation on memory cells, and accordingly, a program voltage level, to which the program speed of the word line that is compensated is applied, may be set. Next, in operations S810 and S840 of FIG. 34, the program speed of the word line may be detected in each program loop and reflected in a program voltage of a next program loop.

Referring to FIG. 30, before performing programming on the memory cells, the memory device may detect a program speed (for example, a primary program speed) of a word line, and may adjust voltage levels of program voltages based on program speeds of each word line. Accordingly, the program speed of each word line may be compensated. However, when the programming is performed, the program speed of the word line may vary, and a program distribution may be increased. According to the operating method of the present embodiment, a program speed of a word line may be detected in each program loop, and a compensation voltage according to the program speed may be reflected in a program voltage of a next program loop, thereby improving program distribution characteristics.

Figure 35:
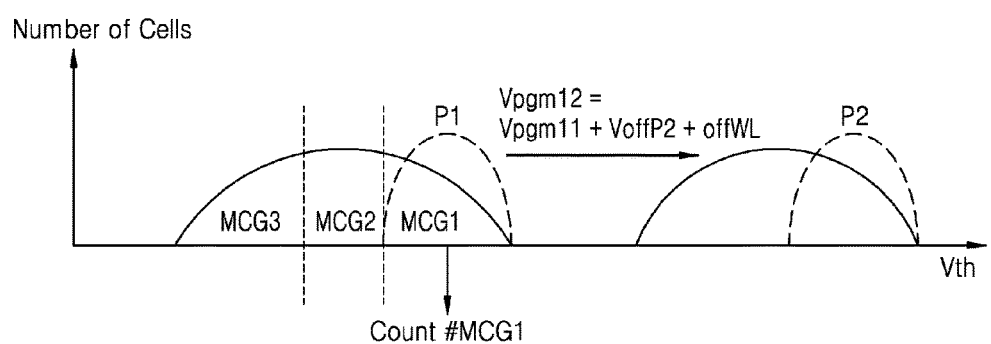
FIG. 35 illustrates a method of detecting a program speed of a word line during programming.

FIG. 35 illustrates a method of detecting a program speed of a word line during a programming operation.

FIG. 35 illustrates a method of detecting a program speed of a word line when programming memory cells by grouping the memory cells into a plurality of cell groups according to their program speeds, according to the programming method of the embodiment of the present disclosure described with reference to FIGS. 5A through 19.

Referring to FIG. 35, when memory cells are programmed to the first program state P1, first, the primary program voltage Vpgm11 may be applied to a word line of the memory cells. Here, some of the memory cells, for example, memory cells of an upper area of a one-shot distribution, may be included in a target distribution of the first program state P1.

A read and verification operation may be performed to group the memory cells into three cell groups. Here, a program speed of a word line may be detected by counting the number of off-cells with respect to the first program state P1. For example, off-cells of the first program state P1 may be cells included in the first cell group MCG1.

Next, memory cells besides the off-cells, for example, memory cells of the second cell group MCG2 and the third cell group MCG3, may be reprogrammed, and accordingly, after all of the memory cells of the second cell group MCG2 and the third cell group MCG are programmed to the first program state P1, some of the memory cells may be programmed to the second program state P2. Here, a program voltage level of the second program state P2 may be set. Voltage levels of program voltages with respect to the second program state P2, for example, a voltage level of the second program voltage set may be set based on a compensation voltage according to a program speed detected during a programming operation of the first program state P1.

The primary program voltage Vpgm12 of the second program state P2 may be set by adding the second program offset VoffP2 to the primary program voltage Vpgm11 of the first program state P1, and a compensation voltage VoffWL according to the program speed may be additionally added to set the primary program voltage Vpgm12. Accordingly, a program speed of a word line detected during programming to the first program state P1 may be reflected in voltage levels of program voltages of the second program state P2.

According to the operating method of the embodiment of the present disclosure, that is, the programming method, a program speed of a word line may be detected in each program loop, and the detected program speed may be reflected in a program voltage of a next program loop, thereby improving distribution characteristics of each program state.

Figure 36:
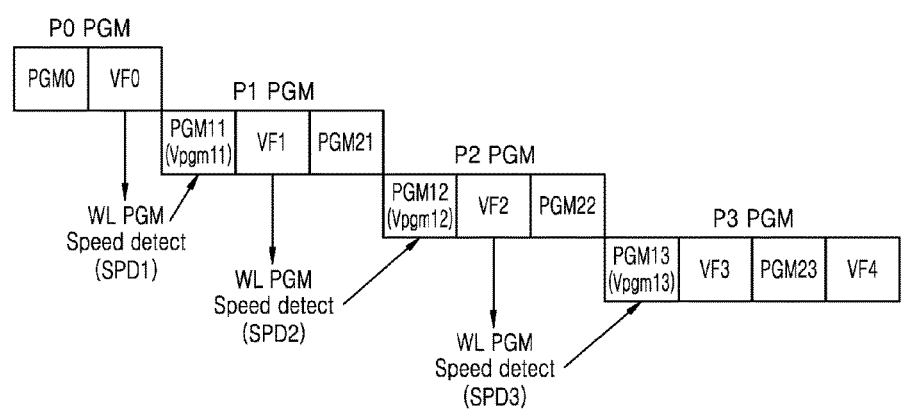
FIG. 36 illustrates a method of operating a memory device, according to example embodiments of the present disclosure.

FIG. 36 illustrates a method of operating a memory device according to example embodiments of the present disclosure.

Referring to FIG. 36, in each program loop, a program speed of a word line may be detected. When a memory cell is a MLC storing 2-bit data, the memory cell may be programmed to one of first through third program states P1, P2, and P3.

Before a programming operation is performed on the memory cells, a primary program speed detecting operation SPD1 may be performed in a verify operation VF0. A voltage level of program voltages corresponding to a first program state P1, for example, a primary program voltage Vpgm11 of the first program state P1, may be adjusted based on a program speed of a word line detected in the primary program speed detecting operation SPD1.

Next, while a programming operation to the first program state P1 is performed, a secondary program speed detecting operation SPD2 may be performed in a verify operation VF1, and a voltage level of program voltages corresponding to the second program state P2 may be adjusted based on a program speed of a word line according to the secondary program speed detecting operation SPD2. For example, a voltage level of a primary program voltage Vpgm12 in the second program state P2 may be adjusted.

While a programming operation to the second program state P2 is performed, a tertiary program speed detecting operation SPD3 may be performed in a verify operation VF2. A voltage level of program voltages corresponding to the third program state P3 may be adjusted based on a program speed of a word line according to the tertiary program speed detecting operation SPD3. For example, a voltage level of a primary program voltage Vpgm13 in the third program state P3 may be adjusted.

Figure 37:
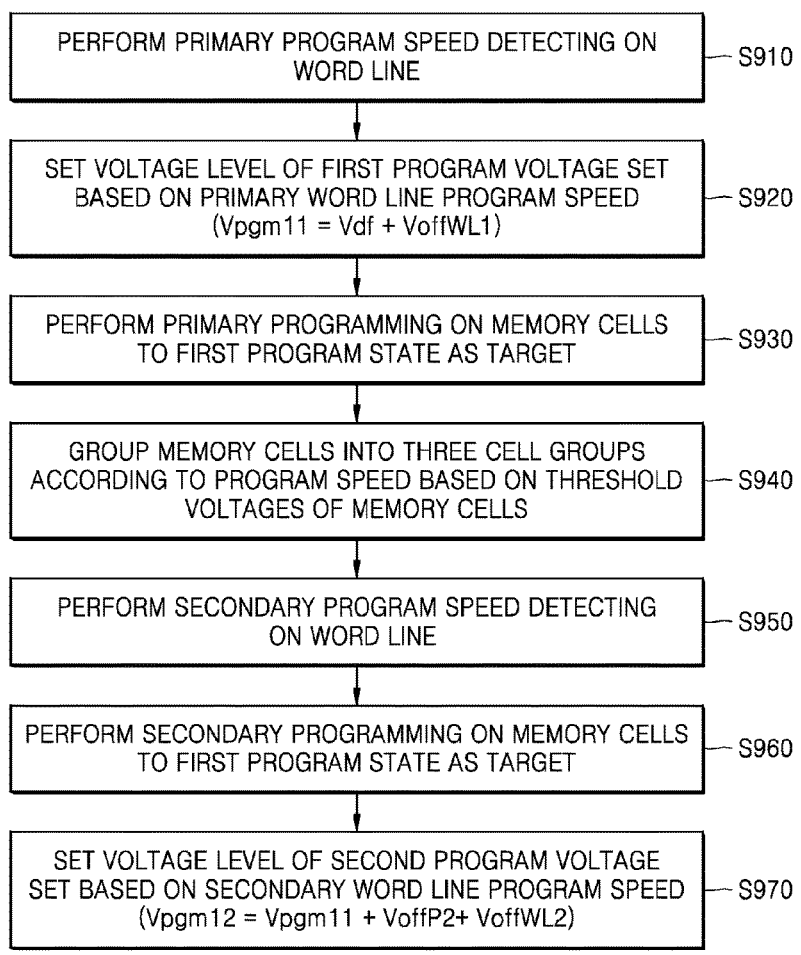
FIG. 37 is a detailed flowchart of a method of operating a memory device, according to example embodiments of the present disclosure.

FIG. 37 is a detailed flowchart of a method of operating a memory device according to example embodiments of the present disclosure.

Referring to FIG. 37, a primary program speed detecting operation may be performed with respect to a word line in an operation S910. The primary program speed detecting operation may be performed before a programming operation is performed on memory cells, and a program voltage level with respect to a first program state may be set based on the detected program speed in an operation S920.

For example, a first compensation voltage VoffWL1 according to their program speeds may be reflected in the primary program voltage Vpgm11 of the first program state P1.

As the primary program voltage Vpgm11 of the first program state P1 is applied to the word line of memory cells, a primary programming operation may be performed on the memory cells to the first program state P1 as a target state in an operation S930.

Next, the memory cells may be grouped into three cell groups according to the program speed based on threshold voltages of the memory cells in an operation S940. Here, a secondary program speed detecting operation with respect to the word line may be performed in an operation S950. When the memory cells are grouped into three cell groups according to their program speeds, a first cell group corresponding to an uppermost state of a threshold voltage range may be included in a target distribution of the first program state P1. The program speed of the word line may be detected by counting the number of memory cells included in the first cell group.

Next, a programming operation to the first program state P1 is performed continuously in an operation S960. A reprogramming operation (for example, second programming or third programming) may be performed on the memory cells so that distributions of cell groups are included in the target distribution of the first program state P1. Accordingly, the memory cells may be programmed to the first program state P1.

After a programming operation to the first program state P1 is completed, in an operation S970, voltage levels of program voltages with respect to a second program state P2 may be set based on the program speed of the word line detected in the secondary program speed detecting operation. For example, a second compensation voltage VoffWL2 according to the program speed may be added to set the primary program voltage Vpgm12 of the second program state P2.

As the primary program voltage Vpgm12 in the second program state P2 is applied to the word line, a primary programming operation may be performed on the memory cells to the second program state P2 as a target state. Next, as described above, a program speed of the word line is detected in each programming operation, and accordingly, voltage levels of program voltages of a next programming operation may be adjusted.

Figure 38:
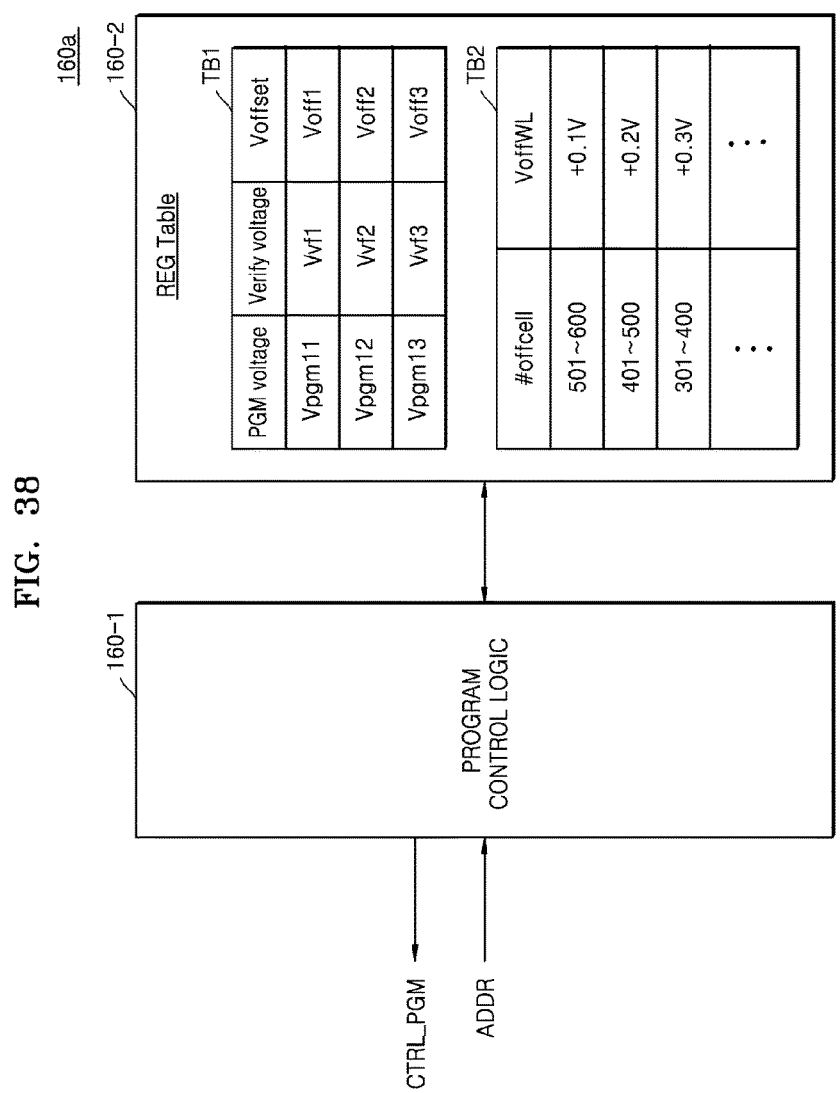
FIG. 38 is a block diagram illustrating an example of a program controller according to example embodiments of the present disclosure.

FIG. 38 is a block diagram illustrating an example of a program controller 160a according to example embodiments of the present disclosure.

According to an embodiment, the program controller 160a may be included in the control logic 150 (see FIG. 1). According to another embodiment, the program controller 160a may be implemented as a separate functional block.

Referring to FIG. 38, the program controller 160a may include a program control logic 160-1 and a register 160-2. The program control logic 160-1 may perform an operation of setting driving voltages for a program operation and store voltage levels of the set driving voltages in the register 160-2. For example, the driving voltages may include program voltages and verify voltages. Also, the program control logic 160-1 may perform an operation of setting a compensation voltage according to a program speed of a word line and store the set compensation voltage of word lines in the register 160-2.

According to an embodiment, driving voltages and compensation voltages of word lines may be stored in the register 160-2 in the form of a table. The register 160-2 may include a first table TB1 including a voltage level of driving voltages, for example, a default level of driving voltages and a second table TB2 including a compensation voltage level according to a program speed of a word line. While the first table TB1 includes program voltages, verify voltages and offset voltages as the driving voltages in FIG. 5A, the embodiments are not limited thereto. The first table TB1 may include various types of driving voltages.

According to an embodiment, the program control logic 160-1 may set a default level of driving voltages before a write request command is received from a memory controller (for example, in an initialization period of a memory device, in a training period or the like). Next, when a program command is received, a program speed of a word line to be programmed is detected, and a level of a compensation voltage VoffWL may be determined based on the program speed.

A voltage level of driving voltages stored in the first table TB1 may be a default level. When a programming operation is performed on each word line, the driving voltages may be compensated by applying the compensation voltage VoffWL to the driving voltages of the default level.

For example, when multi-bit data and a program command are received from a memory controller, the program controller 160a may detect a program speed of a word line, and the control logic 160-1 may access the register 160-2 to set a voltage level of driving voltages corresponding to the program speed of the word line based on the driving voltages of the first table TB1 and the compensation voltages according to the program speed of the second table TB2. In addition, the program controller 160a according to the embodiment of the present disclosure may detect a program speed of a word line during programming, and may set, based on the detected program speed of the word line, a voltage level of driving voltages with respect to a next program state, for example, a voltage level of program voltages, based on a compensation voltage according to the program speed of the word line included in the second table TB2. Also, the program controller 160a may generate a program control signal CTRL_PGM indicating the voltage level of the driving voltages and provide the same to the voltage generator 140 (see FIG. 1).

The structure and function of the program controller 160a included in a memory device are described above with reference to FIG. 38. However, the embodiments of the present disclosure are not limited thereto. The driving voltages and compensation voltages stored in the register 160-2 may be various. Also, the program controller may further perform other various functions to control the memory device such that programming is performed on the memory cell array according to the programming method of the embodiments of the present disclosure.

Figure 39:
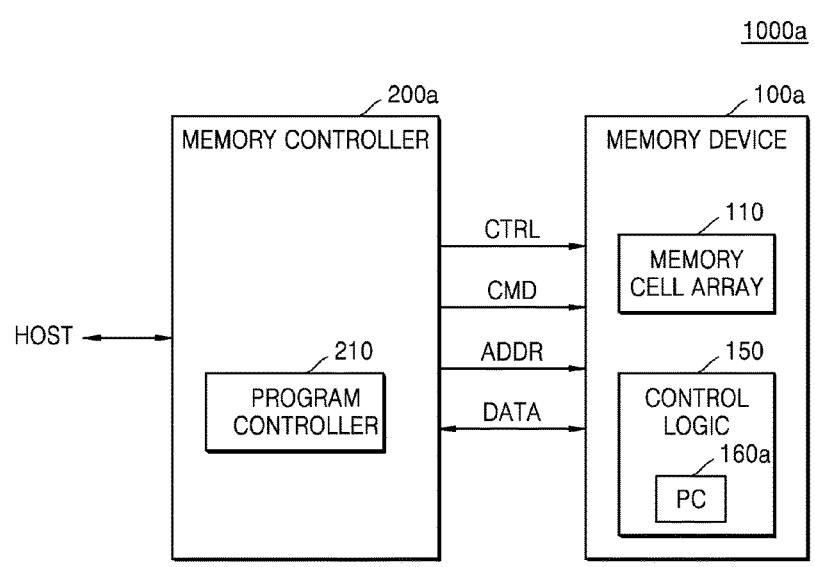
FIG. 39 is a block diagram illustrating a memory system according to certain embodiments of the present disclosure.

FIG. 39 is a block diagram illustrating a memory system 1000 according to certain embodiments of the present disclosure.

The memory system 1000 may be mounted in an electronic device such as a computer, a laptop, a cellular phone, a smart phone, a MP3 player, a Personal Digital Assistants (PDA), a Portable Multimedia Player (PMP), a digital TV, a digital camera, or a portable game console.

Referring to FIG. 39, the memory system 1000a may include a memory device 100a and a memory controller 200a. The memory device 100a may include a memory cell array 110a, and a control logic 150a. The control logic 150a may include a program controller 160a.

The memory cell array 110a may include a plurality of memory cell blocks, and may store data received from the memory controller 200a.

The control logic 150a may control various operations in the memory device 100a based on a command CMD, an address ADDR, and a control signal CTRL received from the memory controller 200a. For example, the control logic 150a may output various control signals used to write data to the memory cell array 110a or read data from the memory cell array 110a.

The program controller 160a may control the memory device 100a such that multi-bit data is stored in the memory cell array 110a. The program controller 160a may control the memory device 100a such that memory cells, which are set to be programmed to one program state, are grouped into at least three cell groups according to program speed, and the memory cells are programmed by applying different program voltages or different number of times of programming to the cell groups from one another. The program controller 160a may detect a program speed of each word line, and may adjust a voltage level of program voltages of respective program states, applied to the word lines, based on a compensation voltage according to the program speed. The program controller 160a may detect a program speed in each program loop, and may adjust voltage levels of program voltages with respect to a next program loop based on a compensation voltage according to the detected program speed. Also, when performing programming on one word line, the program controller 160a may set a program sequence such that primary programming is performed on the word line, and then primary programming is performed on an adjacent word line to the above word line, and then secondary programming is performed on the word line, so that coupling effects between adjacent word lines are reduced. In addition, the program controller 160a may control elements of the memory device 100a, for example, the row decoder 120, the input/output circuit 130, and the voltage generator 140 so that a programming operation is performed according to the programming method of a memory device of the embodiment of the present disclosure described with reference to FIGS. 5A through 38.

In response to a write/read request from a host, the memory controller 200a may control the memory device 100a to read data stored in the memory device 100a or write data to the memory device 100a. In more detail, the memory controller 200a may provide an address ADDR, a command CMD, and a control signal CTRL to the memory device 100a to control a program (or write) operation, a read operation, and an erase operation with respect to the memory device 100a. The memory controller 200a may provide the memory device 100a with data DATA of a size corresponding to a program unit of the memory device 100a, an address ADDR at which the data is stored, and a command CDM indicating a write request.

Although not illustrated, the memory controller 200a may include a Random Access Memory (RAM), a processing unit, a host interface, and a memory interface. The RAM may be used as an operation memory of the processing unit. The processing unit may control operations of the memory controller 200a. The host interface may include a protocol for exchanging data between the host and the memory controller 200a. For example, the memory controller 200a may communicate with an external source (i.e., the host) by using at least one of various interface protocols including a Universal Serial Bus (USB), a Multimedia Card (MMC), a Peripheral Component Interconnect Express (PCI-E), Advanced Technology Attachment (ATA), Serial-ATA, Parallel-ATA, SCSI, ESDI, and Integrated Drive Electronics (IDE).

Meanwhile, according to another embodiment, some of functions of the program controller 160a may be performed in the memory controller 200a by a program controller 210. For example, the memory controller 200a may control a programming operation performed by the memory device 100a on the memory cell array 110a. According to an embodiment, the memory controller 200a may determine a sequence of applying the programming method according to the embodiments of the present disclosure, and provide a control signal CTRL representing the sequence, to the memory device 100a.

For example, a control signal CTRL used to control setting of driving voltages for a programming operation may be provided to the memory device 100a. Also, the memory controller 200a may determine, for example, distribution characteristics of the memory cell array 110a, and may determine how many cell groups the memory cells are to be grouped into, according to program speed, when performing programming. For example, if memory cells of some regions of the memory cell array 110a are deteriorated and distribution characteristics thereof are determined to be poor, and when a programming operation is performed on the memory cells of the above regions, the number of cell groups into which memory cells are grouped according to program speed may be increased so as to improve distribution characteristics of a program state.

As described above, the memory controller 200a may control the memory device 100a such that the program speed of the memory device 100a or distribution characteristics of the memory cells in the program state are improved.

Figure 40:
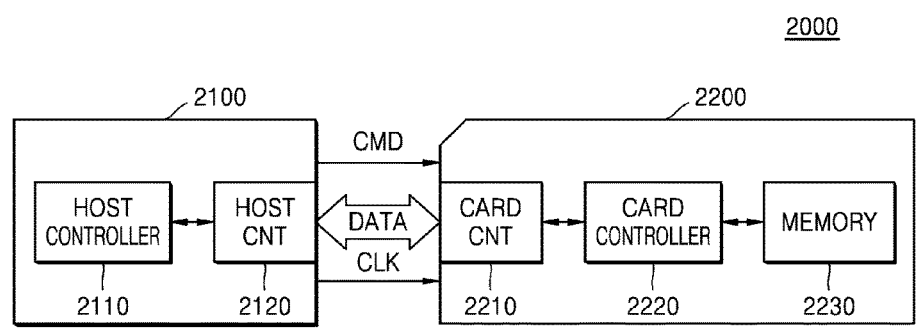
FIG. 40 is a block diagram illustrating a memory card system according to certain embodiments of the present disclosure.

FIG. 40 is a block diagram illustrating a memory card system 2000 according to certain embodiments of the inventive concept.

Referring to FIG. 40, the memory card system 2000 may include a host 2100 and a memory card 2200. The host 2100 may include a host controller 1110 and a host connector 2120. The memory card 2200 may include a card connector 2210, a card controller 2220, and a memory device 2230.

The host 2100 may write data to the memory card 2200 or read data stored in the memory card 2200. The host controller 2110 may transmit a command CMD, a clock signal CLK generated by a clock generator (not shown) of the host 2100, and data DATA through the host connector 2120 to the memory card 2200.

In response to a command received through the card connector 2210, the card controller 2220 may be synchronized with a clock signal generated by a clock generator (not shown) of the card controller 2220 and store data in the memory device 2230. The memory device 2230 may store data transmitted from the host 2100. The memory device 2230 may include the memory device 100 (see FIG. 1) described with reference to FIG. 1, and the memory device 2230 may store data DATA received from the card controller 2220 in a memory cell array, according to the programming method or the operating method according to the embodiments of the present disclosure described with reference to FIGS. 5A and 38. A data programming period may be shortened, and as program distribution characteristics are improved, an operating speed of the memory card 2200 and an operating speed of the memory card system 2000 may be improved.

The memory card 2200 may be embodied by a Compact Flash Card (CFC), a Microdrive, a Smart Media Card (SMC), a MIVIC, a Security Digital Card (SDC), a memory stick, or a USB flash memory driver.

Figure 41:
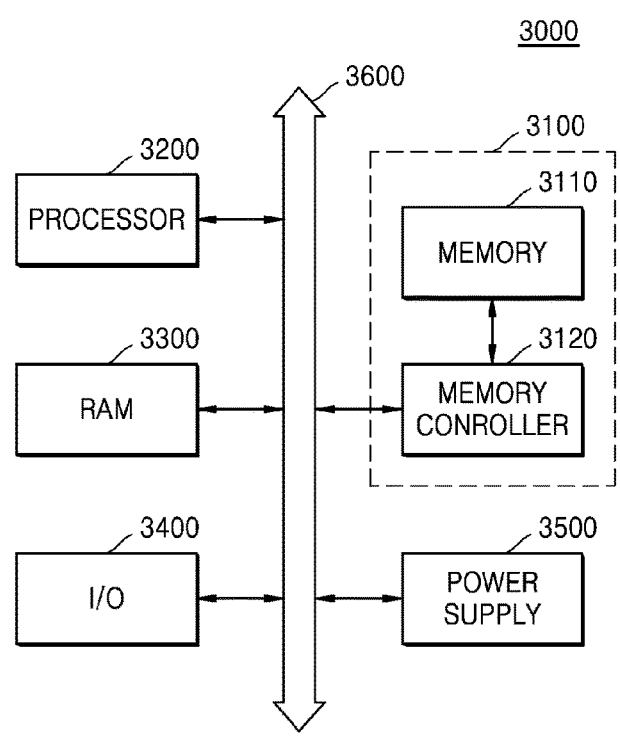
FIG. 41 is a block diagram illustrating a computing system according to certain embodiments of the present disclosure.

FIG. 41 is a block diagram illustrating a computing system 3000 including a memory device according to certain embodiments of the present disclosure.

Referring to FIG. 41, the computing system 3000 may include a memory system 3100, a processor 3200, a RAM 3300, an input/output device 3400, and a power supply 3500. Although not shown in FIG. 41, the computing system 3000 may further include ports, which may communicate with a video card, a sound card, a memory card, or a USB device or communicate with other electronic devices. The computing system 3000 may be embodied by a personal computer (PC) or a portable electronic device, such as a laptop computer, a portable phone, a personal digital assistant (PDA), and a camera.

The processor 3200 may perform specific calculations or tasks. According to an embodiment, the processor 3200 may be a microprocessor or a central processing unit (CPU). The processor 3200 may communicate with the RAM 3300, the I/O device 3400, and the memory system 3100 through a bus 3600, such as an address bus, a control bus, and a data bus. According to an embodiment, the processor 3200 may be also connected to an expansion bus, such as a Peripheral Component Interconnect (PCI) bus.

The memory system 3100 may communicate with the processor 3200, the RAM 3300, and the input/output device 3500 via the bus 3600. The memory system 3100 may store received data or provide the stored data to the processor 3200, the RAM 3300 or the input/output device 3400 according to a request of the processor 3200. Meanwhile, the memory system 3100 may be the memory system 1000a described with reference to FIG. 39. Alternatively, the memory system 3100 may include a memory device 3110 that is the memory device 100 described with reference to FIG. 1, and the memory device 3110 may store data DATA received from the memory controller 3120 according to a programming method or an operating method according to the embodiments of the present disclosure described with reference to FIGS. 5A through 38, in the memory cell array. Accordingly, a data programming period may be shortened, and program distribution characteristics may be improved to thereby improve an operating speed of the memory system 3100 and an operating speed of the computing system 3000.

The RAM 3300 may store data needed for an operation of the computing system 3000. For example, the RAM 3300 may be implemented using a DRAM, a mobile DRAM, an SRAM, a PRAM, an FRAM, an RRAM, and/or an MRAM.

The input/output device 3400 may include an input device such as a keyboard, a keypad, or a mouse, and an output device such as a printer, a display, or the like. The power supply 3500 may supply an operating voltage needed to operate the computing system 2000.

Figure 42:
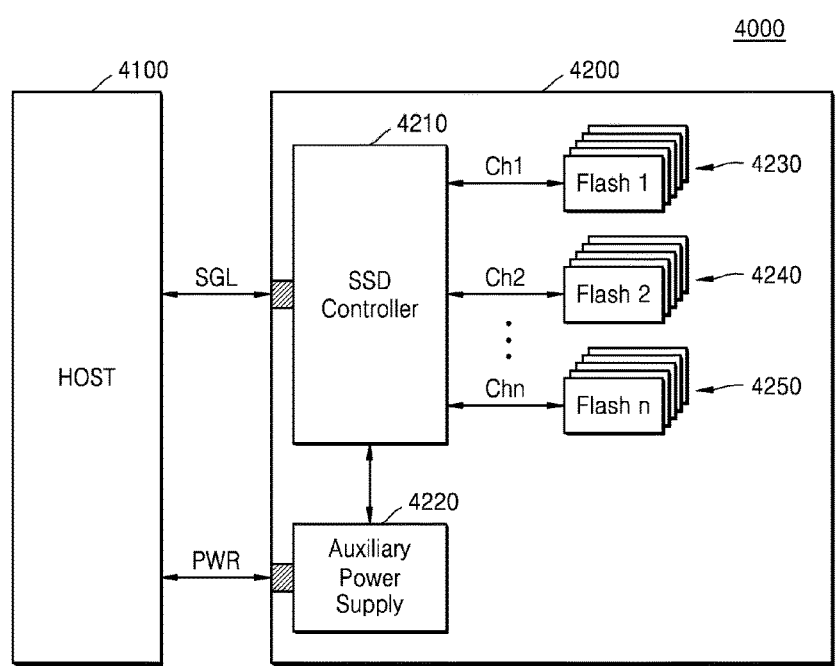
FIG. 42 is a block diagram illustrating a solid state disk (SSD) system according to certain embodiments of the present disclosure.

FIG. 42 is a block diagram illustrating a solid-state disk (SSD) system 4000 according to certain embodiments of the present disclosure.

Referring to FIG. 42, the SSD system 4000 may include a host 4100 and an SSD 4200. The SSD 4200 may exchange signals with the host 4100 through a signal connector and receive power through a power connector.

The SSD 4200 may include an SSD controller 4210, an auxiliary power supply 4220, and a plurality of memory devices 4230, 4240, and 4250. Each of the plurality of memory devices 4230, 4240, and 4250 may be vertical stack-type NAND flash memory devices. At least one of each of the plurality of memory devices 4230, 4240, and 4250 may include the memory device 100 described with reference to FIG. 1. In detail, at least one of each of the plurality of memory devices 4230, 4240, and 4250 may store data DATA received from the SSD controller 4210, in a memory cell array, by using the programming method or the operating method according to the embodiments of the present disclosure described with reference to FIGS. 5A through 38. Accordingly, a data programming period may be shortened, and program distribution characteristics may be improved, thereby improving operating characteristics of the SSD 4200.

Figure 43:
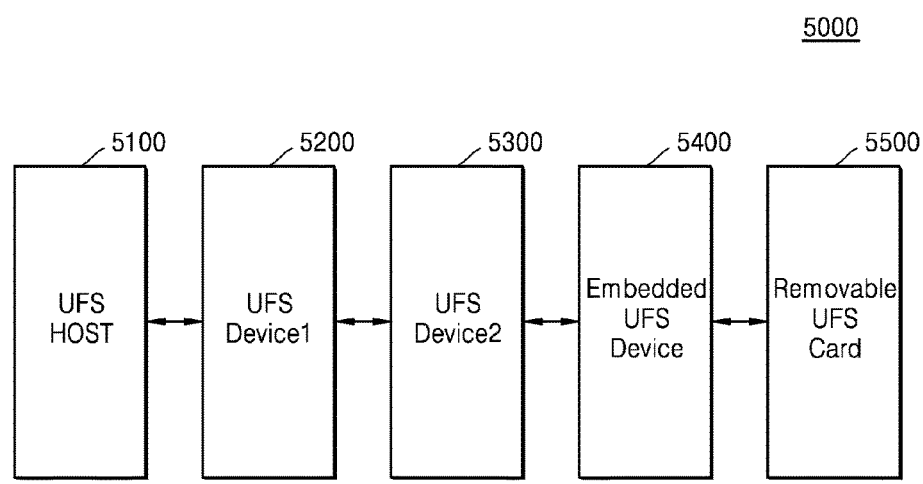
FIG. 43 is a block diagram illustrating a universal flash storage (UFS) according to certain embodiments of the present disclosure.

FIG. 43 is a block diagram illustrating a Universal Flash Storage (UFS) system 5000 according to certain embodiments of the present disclosure.

Referring to FIG. 43, the UFS system 5000 may include a UFS host 5100, UFS devices 5200 and 5300, an embedded UFS device 5400, and a removable UFS card 5500. The UFS host 5100 may be an application processor of a mobile device. The UFS host 5100, the UFS devices 5200 and 5300, the embedded UFS device 5400, and the removable UFS card 5500 may each perform communication with external devices according to the UFS protocol. At least one of the UFS devices 5200 and 5300, the embedded UFS device 5400, and the removable UFS card 5500 may include the memory device 100 illustrated in FIGS. 5A through 38. In addition, the programming method according to the embodiments of the present disclosure described with reference to FIGS. 5A through 38 may be applied to at least one of the UFS devices 5200, 5300, the embedded UFS device 5400, and the removable UFS card 5500. Accordingly, an operating speed of the UFS system 5000 may be improved.

Meanwhile, the embedded UFS device 5400 and the removable UFS card 5500 may perform communication according to other protocols that are different from the UFS protocol. The UFS host 5100 and the removable UFS card 5500 may perform communication according to various card protocols (e.g., UFDs, MMC, SD, mini SD, or Micro SD).

The memory card, the non-volatile memory device, the card controller according to the present disclosure may be mounted using packages of various shapes. For example, the flash memory device and/or the memory controller according to the present disclosure may be mounted using packages such as a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

While the inventive concept has been particularly shown and described with reference to embodiments thereof, it will be understood that various changes in form and details may be made therein without departing from the spirit and scope of the following claims.

What is claimed is:

1. A method of programming a nonvolatile memory device including a plurality of memory cells, the method comprising:
   programming a first set of memory cells of the plurality of memory cells to an N−1th program state (where N is an integer equal to or greater than 2);
   detecting a program speed of a word line connected to the first set of memory cells after the programming of the first set of memory cells is performed;
   adjusting a voltage level of an Nth program voltage set corresponding to an Nth program state based on the detected program speed of the word line; and
   programming at least some of the first set of memory cells to the Nth program state based on the Nth program voltage set, wherein the programming of the first set of memory cells to the N−1th program state comprises grouping the first set of memory cells into a plurality of cell groups at least one cell group having a different threshold voltage range from others according to the program speed of the word line, based on threshold voltage distributions of the first set of memory cells according to a primary program voltage applied to the word line connected to the first set of memory cells, and applying a plurality of secondary program voltages that are set based on threshold voltage ranges of the plurality of cell groups to some of the plurality of cell groups.

2. The method of claim 1, wherein the grouping of the first set of memory cells into the plurality of cell groups is performed by verifying the first set of memory cells, to which the primary program voltage is applied, and
wherein the detecting of the program speed of the word line is performed during the verifying of the first set of the memory cells.

3. The method of claim 2, wherein the detecting of the program speed of the word line comprises counting a number of memory cells detected as off-cells in the N−1th program state during performing the verifying of the first set of the memory cells.

4. The method of claim 3, wherein the nonvolatile memory device comprises a table including voltage levels of compensation voltages according to the number of off-cells, and
wherein voltage levels of the compensation voltages according to the program speed of the word line are determined based on the counted number of off-cells.

5. The method of claim 1, wherein in the adjusting of the voltage level of the Nth program voltage set, a voltage level of the Nth program voltage set is determined based on a compensation voltage according to the program speed of the word line and a primary program voltage of the Nth program voltage set corresponding to the Nth program state.

6. A method of programming a nonvolatile memory device including a plurality of memory cells each cell storing multi-bit data, the method comprising:
programming a first set of memory cells of an nth word line (where n is an integer) to a target program state based on a primary program voltage;
programming a second set of memory cells of an n+1th word line disposed adjacent to the nth word line based on the primary program voltage; and
grouping the first set of memory cells of the nth word line into a plurality of cell groups according to program speeds of the first set of memory cells, at least one cell group having a different threshold voltage range from others, and reprogramming some of the first set of memory cells of the nth word line to the target program state based on a plurality of secondary program voltages that are set based on threshold voltage ranges of the plurality of cell groups.

7. The method of claim 6, wherein the primary program voltage comprises a plurality of first program voltages respectively corresponding to a plurality of program states corresponding to the multi-bit data, and
wherein the programming of the first set of memory cells of the nth word line based on the primary program voltage comprises sequentially applying the plurality of first program voltages to the first set of memory cells of the nth word line.

8. The method of claim 7, wherein the plurality of program states comprise first through third program states, and
wherein the plurality of first program voltages are respectively determined based on the first through third program states.

9. The method of claim 7, wherein the programming of the first set of memory cells of the nth word line based on the primary program voltage comprises:
applying a first primary program voltage corresponding to a first program state, to the nth word line; and
applying a second primary program voltage corresponding to a second program state, to the nth word line.

10. The method of claim 7, wherein when the primary program voltage corresponding to the nth word line is set to program a number of memory cells except m (where m is an integer equal to or greater than 2) memory cells having a relatively high speed from among the first set of memory cells of the nth word line, to respectively corresponding target program states, a respective first cell group having a highest threshold voltage from among the plurality of cell groups corresponding to the program states includes m memory cells.

11. The method of claim 6, wherein the grouping of the first set of memory cells of the nth word line comprises grouping the first set of memory cells into a plurality of cell groups with respect to a plurality of respective program states corresponding to the multi-bit data, and
wherein the reprogramming of some of the first set of memory cells of the nth word line to the target program state comprises reprogramming some of the first set of memory cells of the nth word line to the target program state based on a plurality of secondary program voltages that are set with respect to the plurality of program states based on the threshold voltage ranges of the plurality of cell groups with respect to the plurality of respective program states.

12. The method of claim 11, wherein the grouping into the plurality of cell groups comprises:
grouping the first set of memory cells of the nth word line, to which a first primary program voltage corresponding to a first program state is applied, into a plurality of cell groups with respect to the first program state; and
grouping the first set of memory cells of the nth word line, to which a first primary program voltage corresponding to a second program state is applied, into a plurality of cell groups with respect to the second program state.

13. The method of claim 6, wherein in the grouping the first set of memory cells of the nth word line and the reprogramming some of the first set of memory cells of the nth word line to the target program state, when the target program state is first and second program states, comprises:
grouping a first group of memory cells, to which a first primary program voltage corresponding to the first program state is applied, from among the first set of memory cells of the nth word line, into a plurality of cell groups, and reprogramming the first group of memory cells based on a first secondary program voltage; and
grouping a second group of memory cells, to which a second primary program voltage corresponding to the second program state is applied, from among the first set of memory cells of the nth word line, into a plurality of cell groups, and reprogramming the second group of memory cells based on a second secondary program voltage.

14. The method of claim 6, further comprising:
detecting a primary program speed of the nth word line; and adjusting a voltage level of the primary program voltage corresponding to each of a plurality of program states corresponding to the multi-bit data based on the primary program speed.

15. The method of claim 14, wherein the detecting of a primary program speed of the nth word line comprises:
applying a pre-program voltage to the nth word line to program the first set of memory cells to a pre-program state; and
counting a number of memory cells detected as off-cells with respect to the pre-program state.

* * * * *